United States Patent
Shibata et al.

(10) Patent No.: US 9,966,922 B2
(45) Date of Patent: May 8, 2018

(54) MAGNETORESISTIVE EFFECT DEVICE

(71) Applicant: TDK CORPORATION, Tokyo (JP)

(72) Inventors: Tetsuya Shibata, Tokyo (JP); Junichiro Urabe, Tokyo (JP); Takekazu Yamane, Tokyo (JP); Tsuyoshi Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days. days.

(21) Appl. No.: 15/600,066

(22) Filed: May 19, 2017

(65) Prior Publication Data
US 2017/0345449 A1 Nov. 30, 2017

(30) Foreign Application Priority Data

May 25, 2016 (JP) .................................. 2016-103900
Feb. 15, 2017 (JP) .................................. 2017-026216

(51) Int. Cl.
  *H03H 2/00* (2006.01)
  *H01L 43/00* (2006.01)
  *G11B 5/39* (2006.01)

(52) U.S. Cl.
  CPC ............. *H03H 2/00* (2013.01); *G11B 5/3945* (2013.01); *H01L 43/00* (2013.01)

(58) Field of Classification Search
  CPC ...... H03H 7/01; H03H 7/0138–7/0184; H03H 2001/0057
  See application file for complete search history.

(56) References Cited

U.S. PATENT DOCUMENTS 7,532,084 B2 * 5/2009 Wada .................. H01P 1/36
  333/24.2
7,626,471 B2 * 12/2009 Kishimoto ............. H01P 1/387
  333/1.1

(Continued)

FOREIGN PATENT DOCUMENTS

| JP | 2017-063397 A | 3/2017 |
| WO | 2017/056559 A1 | 4/2017 |
| WO | 2017/056560 A1 | 4/2017 |

OTHER PUBLICATIONS

Tulapurkar, A.A. et al., "Spin-torque Diode Effect in Magnetic Tunnel Junctions," Nature, vol. 348, No. 7066, pp. 339-342 (2005).

*Primary Examiner* — Dean Takaoka
*Assistant Examiner* — Alan Wong
(74) *Attorney, Agent, or Firm* — Oliff PLC

(57) ABSTRACT

A magnetoresistive effect device includes a magnetoresistive effect element first and second ports, a signal line, an inductor, and a direct current input terminal. The first port, the magnetoresistive effect element, and the second port are connected in series in this order via the signal line. The inductor is connected to one of the signal line between the magnetoresistive effect element and the first port and the signal line between the magnetoresistive effect element and the second port and is capable of being connected to ground. The direct-current input terminal is connected to the other of the above signal lines. A closed circuit including the magnetoresistive effect element, the signal line, the inductor, the ground, and direct-current input terminal is capable of being formed. The magnetoresistive effect element is arranged so that direct current flows in a direction from a magnetization fixed layer to a magnetization free layer.

9 Claims, 10 Drawing Sheets

(56) References Cited

U.S. PATENT DOCUMENTS

| | | | | |
|---|---|---|---|---|
| 7,678,475 | B2* | 3/2010 | Slavin | B82Y 25/00 |
| | | | | 257/421 |
| 7,825,658 | B2* | 11/2010 | Koga | B82Y 25/00 |
| | | | | 324/252 |
| 7,825,744 | B2* | 11/2010 | Kawanami | H01P 1/387 |
| | | | | 333/1.1 |
| 8,019,315 | B2* | 9/2011 | Kakinuma | H03D 7/00 |
| | | | | 327/356 |
| 8,583,073 | B2* | 11/2013 | Kakinuma | H03D 7/00 |
| | | | | 327/356 |
| 9,837,105 | B2* | 12/2017 | Hashimoto | G11B 5/3909 |
| 2016/0277000 | A1 | 9/2016 | Shibata et al. | |

* cited by examiner

MAGNETORESISTIVE EFFECT DEVICE

BACKGROUND OF THE INVENTION

1. Field of the Invention

The present invention relates to a magnetoresistive effect device including a magnetoresistive effect element.

2. Description of the Related Art

The speed of wireless communication has increased in recent years with the increasing functions of mobile communication terminals, such as mobile phones. Since the communication speed is proportional to the band width of frequencies that are used, the number of frequency bands necessary for communication is increased. Accordingly, the number of high-frequency filters that are mounted in mobile communication terminals is increased. Spintronics has been studied in recent years as a field that is probably applicable to new high-frequency components. One phenomenon that has received attention is the spin torque resonance phenomenon, which is caused by a magnetoresistive effect element (refer to Nature, Vol. 438, No. 7066, pp. 339 to 342 17 Nov. 2005). Application of alternating current to a magnetoresistive effect element causes spin torque resonance in the magnetoresistive effect element, and the resistance value of the magnetoresistive effect element oscillates with a fixed cycle at a frequency corresponding to a spin torque resonance frequency. The spin torque resonance frequency of the magnetoresistive effect element varies with the strength of the magnetic field applied to the magnetoresistive effect element. The spin torque resonance frequency of the magnetoresistive effect element is generally within a high-frequency band from several gigahertz to several tens of gigahertz.

SUMMARY OF THE INVENTION

Although the magnetoresistive effect element may be applied to a high-frequency device utilizing the spin torque resonance phenomenon, specific configurations to apply the magnetoresistive effect element to a high-frequency device, such as a high-frequency filter, have not been proposed. Accordingly, the present invention aims to provide a magnetoresistive effect device capable of realizing a high-frequency device, such as a high-frequency filter, which includes a magnetoresistive effect element.

A magnetoresistive effect device according to an embodiment of the present invention includes at least one magnetoresistive effect element including a magnetization fixed layer, a magnetization free layer, and a spacer layer arranged between the magnetization fixed layer and the magnetization free layer; a first port through which a high-frequency signal is input; a second port through which a high-frequency signal is output; a signal line; an inductor or a resistance element; and a direct-current input terminal. The first port, the magnetoresistive effect element, and the second port are connected in series in this order via the signal line. The inductor or the resistance element is connected to one of the signal line between the magnetoresistive effect element and the first port and the signal line between the magnetoresistive effect element and the second port and is capable of being connected to ground. The direct-current input terminal is connected to the other of the signal line between the magnetoresistive effect element and the first port and the signal line between the magnetoresistive effect element and the second port. A closed circuit including the magnetoresistive effect element, the signal line, the inductor, the ground, and direct-current input terminal or a closed circuit including the magnetoresistive effect element, the signal line, the resistance element, the ground, and direct-current input terminal is capable of being formed. The magnetoresistive effect element is arranged so that direct current supplied from the direct-current input terminal flows through the magnetoresistive effect element in a direction from the magnetization fixed layer to the magnetization free layer.

With the above magnetoresistive effect device, the input of the high-frequency signal from the first port to the magnetoresistive effect element via the signal line enables spin torque resonance to be induced in the magnetoresistive effect element. Due to the direct current flowing through the magnetoresistive effect element in the direction from the magnetization fixed layer to the magnetization free layer simultaneously with the spin torque resonance, the element impedance of the magnetoresistive effect element at a frequency equal to the spin torque resonance frequency is increased. The series connection of the first port, the magnetoresistive effect element, and the second port through which a high-frequency signal is output in this order enables the high-frequency signal to be passed at a non-resonant frequency at which the magnetoresistive effect element is in a low impedance state and to be cut off at a resonant frequency at which the magnetoresistive effect element is in a high impedance state. In other words, the magnetoresistive effect device is capable of having frequency characteristics as a high-frequency filter.

The direct current supplied from the direct-current input terminal flows through the closed circuit including the magnetoresistive effect element, the signal line, the inductor, the ground, and the direct-current input terminal or the closed circuit including the magnetoresistive effect element, the signal line, the resistance element, the ground, and direct-current input terminal. The closed circuit enables the direct current to be efficiently applied to the magnetoresistive effect element. Since the application of the direct current increases the amount of change in element impedance of the magnetoresistive effect element, the magnetoresistive effect device may function as a high-frequency filter having a wide range of cut-off characteristics and bandpass characteristics.

The magnetoresistive effect device preferably further includes at least one frequency setting mechanism capable of setting a spin torque resonance frequency of the magnetoresistive effect element.

Since the spin torque resonance frequency of the magnetoresistive effect element is capable of being set to an arbitrary value in the above magnetoresistive effect device, the magnetoresistive effect device may function as a filter having art arbitrary frequency band.

In the magnetoresistive effect device, the frequency setting mechanism may be an effective magnetic field setting mechanism capable of setting an effective magnetic field in the magnetization free layer and may be capable of varying the spin torque resonance frequency of the magnetoresistive effect element by varying the effective magnetic field.

With the above magnetoresistive effect device, since the spin torque resonance frequency of the magnetoresistive effect element is capable of being variably controlled, the magnetoresistive effect device may function as a frequency variable filter.

In the magnetoresistive effect device, the at least one magnetoresistive effect element may include multiple magnetoresistive effect elements having different spin torque resonance frequencies, and the multiple magnetoresistive effect elements may be connected in parallel to each other.

With the above magnetoresistive effect device, since the multiple magnetoresistive effect elements having different spin torque resonance frequencies are connected in parallel to each other, a cutoff frequency band having a certain width is provided.

In the magnetoresistive effect device, the at least one magnetoresistive effect element may include multiple magnetoresistive effect elements, the multiple magnetoresistive effect elements may be connected in parallel to each other, and the at least one frequency setting mechanism may include multiple frequency setting mechanisms so that the spin torque resonance frequencies of the multiple magnetoresistive effect elements are capable of being individually set.

With the above magnetoresistive effect device, since the multiple frequency setting mechanisms are provided so as to individually set the spin torque resonance frequencies of the multiple magnetoresistive effect devices, the spin torque resonance frequencies of the respective magnetoresistive effect elements are capable of being individually controlled. In addition, since the multiple magnetoresistive effect elements are connected in parallel to each other, a cutoff frequency band having a certain width is provided.

In the magnetoresistive effect device, the at least one magnetoresistive effect element may include multiple magnetoresistive effect elements having different spin torque resonance frequencies, and the multiple magnetoresistive effect elements may be connected in series to each other.

With the above magnetoresistive effect device, since the multiple magnetoresistive effect elements having different spin torque resonance frequencies are connected in series to each other, a cutoff frequency band having a certain width is provided.

In the magnetoresistive effect device, the at least one magnetoresistive effect element may include multiple magnetoresistive effect elements, the multiple magnetoresistive effect elements may be connected in series to each other, and the at least one frequency setting mechanism may include multiple frequency setting mechanisms so that the spin torque resonance frequencies of the multiple magnetoresistive effect elements are capable of being individually set.

With the above magnetoresistive effect device, since the multiple frequency setting mechanisms are provided so as to individually set the spin torque resonance frequencies of the multiple magnetoresistive effect devices, the spin torque resonance frequencies of the respective magnetoresistive effect elements are capable of being individually controlled. In addition, since the multiple magnetoresistive effect elements are connected in series to each other, a cutoff frequency band having a certain width is provided.

In the magnetoresistive effect device, the plan view shapes of the multiple magnetoresistive effect elements having different spin torque resonance frequencies may be different from each other in aspect ratio. "The plan view shape" means the shape of each of the magnetoresistive effect elements when the magnetoresistive effect element is viewed from above a plane perpendicular to the stacking direction of the respective layers composing the magnetoresistive effect element. "The aspect ratio" means the ratio of the length of the long sides to the length of the short sides of a rectangle circumscribed around the plan view shape of the magnetoresistive effect element with a minimum area.

With the above magnetoresistive effect device, since the plan view shapes of the multiple magnetoresistive effect elements having different spin torque resonance frequencies have different aspect ratios from each other, it is possible to manufacture the multiple magnetoresistive effect elements having different spin torque resonance frequencies from each other through the same process. Specifically, since the multiple magnetoresistive effect elements have the same film structure in the magnetoresistive effect device, it is possible to collectively form the films of the layers composing the multiple magnetoresistive effect elements.

According to the embodiment of the present invention, it is possible to provide a magnetoresistive effect device capable of realizing a high-frequency device, such as a high-frequency filter, which includes a magnetoresistive effect element.

DESCRIPTION OF THE PREFERRED EMBODIMENTS

Embodiments of the present invention will herein be described in detail with reference to the attached drawings. The present invention is not limited by the content described in the following embodiments. Components described below include components easily supposed by persons skilled in the art, components substantially equivalent to each other, and components within an equivalent range. In addition, the components described below may be appropriately combined with each other. Furthermore, the components may be omitted, replaced, or modified without departing from the true spirit and scope of the invention.

First Embodiment

Figure 1:
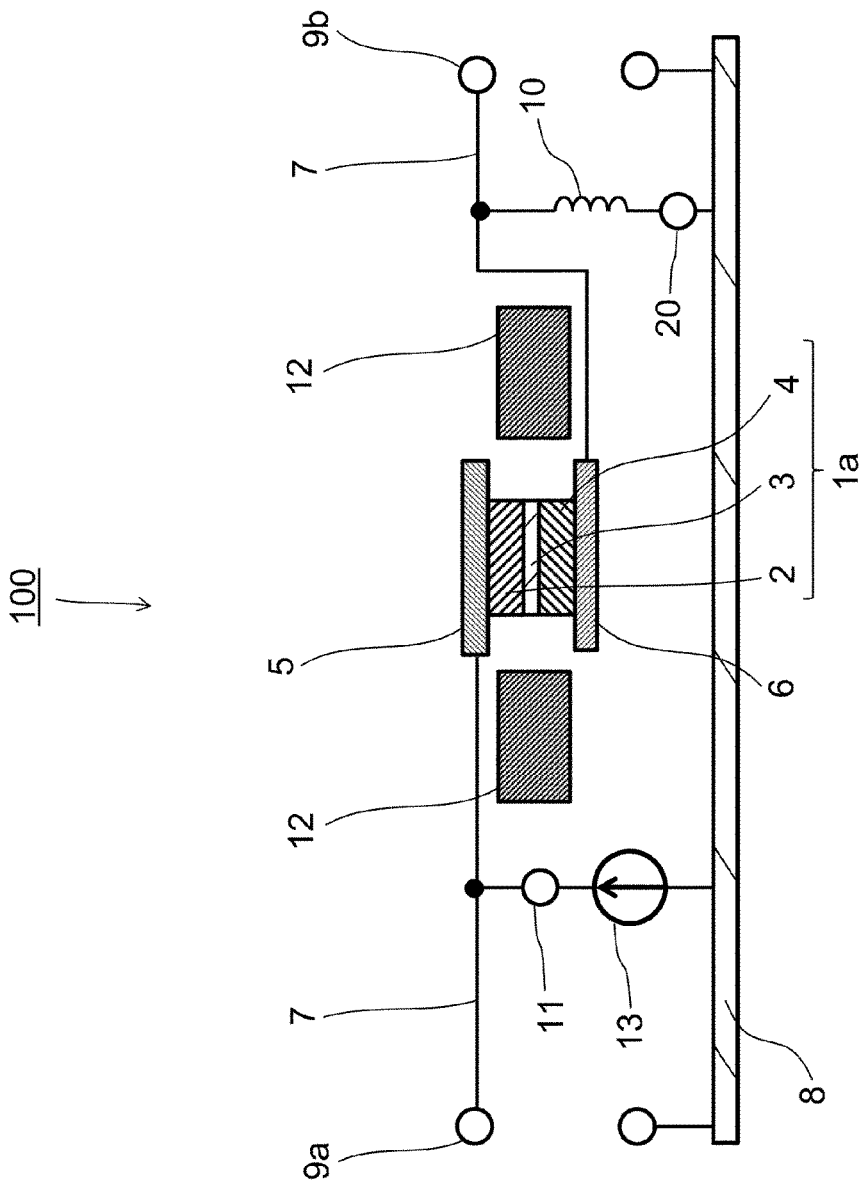
FIG. 1 is a schematic cross-sectional view of a magnetoresistive effect device according to a first embodiment.

FIG. 1 is a schematic cross-sectional view of a magnetoresistive effect device 100 according to a first embodiment of the present invention. The magnetoresistive effect device 100 includes a magnetoresistive effect element 1a, an upper electrode 5, a lower electrode 6, a first port 9a, a second port 9b, a signal line 7, an inductor 10, a direct-current input terminal 11, and a magnetic-field applying mechanism 12 serving as a frequency setting mechanism. The magnetoresistive effect element 1a includes a magnetization fixed layer 2, a spacer layer 3, and a magnetization free layer 4. The first port 9a, the magnetoresistive effect element 1a, and the second port 9b are connected in series in this order via the signal line 7. The inductor 10 is connected to the signal line 7 between the magnetoresistive effect element 1a and the second port 9b (one of the signal line 7 between the magnetoresistive effect element 1a and the first port 9a and the signal line 7 between the magnetoresistive effect element 1a and the second port 9b) and is capable of being connected to ground 8 via a reference voltage terminal 20. The direct-current input terminal 11 is connected to the signal line 7 between the magnetoresistive effect element 1a and the first port 9a (the other of the signal line 7 between the magnetoresistive effect element 1a and the first port 9a and the signal line 7 between the magnetoresistive effect element 1a and the second port 9b). In other words, the direct-current input terminal 11 is connected to the signal line 7 at the opposite side to the inductor 10 with the magnetoresistive effect element 1a in between the direct-current input terminal 11 and the inductor 10. A closed circuit including the magnetoresistive effect element 1a, the signal line 7, the inductor 10, the ground 8, and the direct-current input terminal 11 is capable of being formed when the magnetoresistive effect device 100 is connected to the ground 8. More specifically, in the magnetoresistive effect device 100, the connection of the inductor 10 to the ground 8 via the reference voltage terminal 20 and the connection of a direct-current source 13 connected to the ground 8 to the direct-current input terminal 11 enable the closed circuit including the magnetoresistive effect element 1a, the signal line 7, the inductor 10, the ground 8, and the direct-current input terminal 11 to be formed.

The first port 9a is an input port through which a high-frequency signal, which is an alternating current signal, is input and the second port 9b is an output port through which a high-frequency signal is output. The high-frequency signal input through the magnetoresistive effect element 1a and the high-frequency signal output through the second port 9b are, for example, signals having frequencies of 100 MHz or more. The signal line 7 is electrically connected to the magnetoresistive effect element 1a via the upper electrode 5 and the lower electrode 6 so as to sandwich the magnetoresistive effect element 1a between the upper electrode 5 and the lower electrode 6. The high-frequency signal input through the first port 9a flows through the magnetoresistive effect element 1a and is supplied to the second port 9b. Attenuation (S21), which is a dB value of a power ratio (output power/input power) when the high-frequency signal is supplied from the first port 9a to the second port 9b, is capable of being measured with a high-frequency measuring device, such as a network analyzer.

The upper electrode 5 and the lower electrode 6 serve as a pair of electrodes and are disposed in the stacking direction of the respective layers composing the magnetoresistive effect element 1a with the magnetoresistive effect element 1a in between the upper electrode 5 and the lower electrode 6. Specifically, the upper electrode 5 and the lower electrode 6 function as a pair of electrodes to cause a signal (current) to flow through the magnetoresistive effect element 1a in a direction intersecting with the face of each layer composing the magnetoresistive effect element 1a, for example, in a direction (stacking direction) perpendicular to the face of each layer composing the magnetoresistive effect element 1a. Each of the upper electrode 5 and the lower electrode 6 is preferably composed of a film made of Ta, Cu, Au, AuCu, or Ru or a film made of two or more of the above materials. One end (at the magnetization fixed layer 2 side) of the magnetoresistive effect element 1a is electrically connected to the signal line 7 via the upper electrode 5 and the other end (at the magnetization free layer 4 side) of the magnetoresistive effect element 1a is electrically connected to the signal line 7 via the lower electrode 6.

The ground 8 functions as reference voltage. The shape of the signal line with the ground 8 is preferably of a micro strip line (MSL) type or a coplanar waveguide (CPW) type. In design of the micro strip line shape or the coplanar waveguide shape, designing the width of the signal line 7 and the distance to the ground so that the characteristic impedance of the signal line 7 is equal to the impedance of a circuit system enables the transmission loss through the signal line 7 to be reduced.

The inductor 10 is connected between the signal line 7 and the ground 8 and has a function to cut off high-frequency components of the current and pass direct-current components of the current with its inductance component. The inductor 10 may be a chip inductor or an inductor composed of a pattern line. Alternatively, the inductor 10 may be a resistance element having an inductance component. The inductor 10 preferably has an inductance value of 10 nH or more. The use of the inductor 10 enables direct current applied from the direct-current input terminal 11 to flow through the closed circuit including the magnetoresistive effect element 1a, the signal line 7, the inductor 10, the ground 8, and the direct-current input terminal 11 without degrading the characteristics of the high-frequency signal passing through the magnetoresistive effect element 1a.

The direct-current input terminal 11 is connected to the signal line 7 at the opposite side to the inductor 10 with the magnetoresistive effect element 1a in between the direct-current input terminal 11 and the inductor 10. More specifically, the direct-current input terminal 11 is connected to the signal line 7 between the magnetoresistive effect element 1a and the first port 9a. The connection of the direct-current source 13 to the direct-current input terminal 11 enables the direct current to be applied to the magnetoresistive effect element 1a. The magnetoresistive effect element 1a is arranged so that the direct current supplied from the direct-current input terminal 11 flows through the magnetoresistive effect element 1a in a direction from the magnetization fixed layer 2 to the magnetization free layer 4. An inductor or a resistance element for cutting off the high-frequency signal may be connected in series between the direct-current input terminal 11 and the direct-current source 13.

The direct-current source 13 is connected to the ground 8 and the direct-current input terminal 11 and applies the direct current from the direct-current input terminal 11 to the closed circuit including the magnetoresistive effect element 1a, the signal line 7, the inductor 10, the ground 8, and the direct-current input terminal 11. The direct-current source 13 is composed of, for example, a circuit in which a variable resistor is combined with a direct-current voltage source and is capable of varying the current value of the direct current. The direct-current source 13 may be composed of a circuit which is capable of generating constant direct current and in which a fixed resistor is combined with a direct-current voltage source.

The magnetic-field applying mechanism 12 is disposed near the magnetoresistive effect element 1a and applies a magnetic field to the magnetoresistive effect element 1a to enable setting of a spin torque resonance frequency of the magnetoresistive effect element 1a. For example, the magnetic-field applying mechanism 12 is of an electromagnetic type or a strip line type capable of variably controlling the strength of the applied magnetic field using voltage or current. Alternatively, the magnetic-field applying mechanism 12 may be a combination of the electromagnetic type or the strip line type with a permanent magnet that supplies only a constant magnetic field. In addition, the magnetic-field applying mechanism 12 varies an effective magnetic field in the magnetization free layer 4 by varying the magnetic field to be applied to the magnetoresistive effect element 1a to enable the spin torque resonance frequency Of the magnetoresistive effect element 1a to be varied.

The magnetization fixed layer 2 is made of a ferromagnetic material and the magnetization direction of the magnetization fixed layer 2 is substantially fixed to one direction. The magnetization fixed layer 2 is preferably made of a material having high spin polarizability, such as Fe, Co, Ni, an alloy of Ni and Fe, an alloy of Fe and Co, or an alloy of Fe, Co, and B. This achieves a high magnetoresistive change rate. The magnetization fixed layer 2 may be made of a Heusler alloy. The magnetization fixed layer 2 preferably has a film thickness or 1 nm to 10 nm. An antiferromagnetic layer may be added so as to be in contact with the magnetization fixed layer 2 in order to fix the magnetization of the magnetization fixed layer 2. Alternatively, the magnetization of the magnetization fixed layer 2 may be fixed using magnetic anisotropy caused by the crystal structure of the magnetization fixed layer 2 or the shape thereof. The antiferromagnetic layer may be made of FeO, CoO, NiO, $CuFeS_2$, IrMn, FeMn, PtMn, Cr, or Mn.

The spacer layer 3 is arranged between the magnetization fixed layer 2 and the magnetization free layer 4. The magnetization of the magnetization fixed layer 2 and the magnetization of the magnetization free layer 4 interact with each other to achieve the magnetoresistive effect. The spacer layer 3 may be formed of a layer made of a conductive material, an insulating material, or a semiconductor material. Alternatively, the spacer layer 3 may be formed of a layer in which a current flow point composed of a conductor is included in an insulator.

When a non-magnetic conductive material is used for the spacer layer 3, the non-magnetic conductive material may be Cu, Ag, Au, or Ru. In this case, a giant magnetoresistive (GMR) effect is produced in the magnetoresistive effect element 1a. When the GMR effect is used, the spacer layer 3 preferably has a film thickness of about 0.5 nm to 3.0 nm.

When a non-magnetic insulating material is used for the spacer layer 3, the non-magnetic insulating material may be $Al_2O_3$ or MgO. In this case, a tunnel magnetoresistive (TMR) effect is produced in the magnetoresistive effect element 1a. Adjusting the film thickness of the spacer layer 3 so that a coherent tunnel effect is produced between the magnetization fixed layer 2 and the magnetization free layer 4 achieves a high magnetoresistive change rate. When the TMR effect is used, the spacer layer 3 preferably has a film thickness of about 0.5 nm to 3.0 nm.

When a non-magnetic semiconductor material is used for the spacer layer 3, the non-magnetic semiconductor material may be SnO, $In_2O_3$, $SnO_2$, ITO, $GaO_x$, or $Ga_2O_x$. The spacer layer 3 preferably has a film thickness of about 1.0 nm to 4.0 nm.

When a layer in which the current flow point composed of a conductor is included in a non-magnetic insulator is used as the spacer layer 3, the spacer layer 3 preferably has a structure in which the current flow point composed of a conductor made of, for example, CoFe, CoFeB, CoFeSi, CoMnGe, CoMnSi, CoMnAl, Fe, Co, Au, Cu, Al, or Mg is included in the non-magnetic insulator made of $Al_2O_3$ or MgO. In this case, the spacer layer 3 preferably has a film thickness of about 0.5 nm to 2.0 nm.

The direction of the magnetization of the magnetization free layer 4 is capable of being varied. The magnetization free layer 4 is made of a ferromagnetic material. The direction of the magnetization of the magnetization free layer 4 is capable of being varied with, for example, an externally applied magnetic field or spin polarized electrons. When the magnetization free layer 4 is made of a material having a magnetic easy axis in an in-plane direction, the material may be, for example, CoFe, CoFeB, CoFeSi, CoMnGe, CoMnSi, or CoMnAl. The magnetization free layer 4 preferably has a film thickness of about 1 nm to 30 nm. When the magnetization free layer 4 is made of a material having the magnetic easy axis in a plane normal direction, the material may be, for example, Co, a CoCr-based alloy, a Co multilayer film, a CoCrPt-based alloy, an FePt-based alloy, an SmCo-based alloy including rare earth, or a TbFeCo alloy. The magnetization free layer 4 may be made of a Heusler alloy. A material having high spin polarizability may be disposed between the magnetization free layer 4 and the spacer layer 3. This achieves a high magnetoresistive change rate. The material having a high spun polarizability may be, for example, a CoFe alloy or a CoFeB alloy. Each of the CoFe alloy and the CoFeB alloy preferably has a film thickness of about 0.2 nm to 1.0 nm.

A cap layer, a seed layer, or a buffer layer may be disposed between the upper electrode 5 and the magnetoresistive effect element 1a and between the lower electrode 6 and the magnetoresistive effect element 1a. Each of the cap layer, the seed layer, and the buffer layer may be made of Ru, Ta, Cu, or Cr or may be formed of a stacked film including a Ru layer, a Ta layer, a Cu layer, and a Cr layer. Each of the cap layer, the seed layer, and the buffer layer preferably has a film thickness of about 2 nm to 10 nm.

When the magnetoresistive effect element 1a has a rectangular shape (including a square shape) in plan view, the magnetoresistive effect element 1a desirably has long sides of about 100 nm or 100 nm or less. When the magnetoresistive effect element 1a does not have a rectangular shape in plan view, the long sides of a rectangle circumscribed around the plan view shape of the magnetoresistive effect element 1a with a minimum area are defined as the long sides of the magnetoresistive effect element 1a. When the long sides of the magnetoresistive effect element 1a are short, for example, about 100 nm, the magnetization of the magnetization free layer 4 is capable of having a single magnetic domain to realize the spin torque resonance phenomenon with high efficiency. The "plan view shape" means the shape of the magnetoresistive effect element when the magnetoresistive effect element is viewed from above a plane perpendicular to the stacking direction of the respective layers composing the magnetoresistive effect element.

The spin torque resonance phenomenon will now be described.

Upon input of the high-frequency signal of a frequency equal to the spin torque resonance frequency specific to the magnetoresistive effect element 1a into the magnetoresistive effect element 1a, the magnetization of the magnetization free layer 4 oscillates at the spin torque resonance frequency.

This phenomenon is called the spin torque resonance phenomenon. The element resistance value of the magnetoresistive effect element 1a is determined by the relative angle between the magnetization of the magnetization fixed layer 2 and the magnetization of the magnetization free layer 4. Accordingly, the resistance value of the magnetoresistive effect element 1a in the spin torque resonance varies with a fixed cycle with the oscillation of the magnetization of the magnetization free layer 4. In other words, the magnetoresistive effect element 1a is capable of being considered as a resistor oscillation element the resistance value of which varies with a fixed cycle at the spin torque resonance frequency. In addition, upon input of the high-frequency signal of a frequency equal to the spin torque resonance frequency into the magnetoresistive effect element 1a while applying the direct current flowing through the magnetoresistive effect element 1a in the direction from the magnetization fixed layer 2 to the magnetization free layer 4 to the magnetoresistive effect element 1a, the resistance value of the magnetoresistive effect element 1a varies with a fixed cycle at the spin torque resonance frequency out of phase with the input high-frequency signal by 180 degrees and the impedance for the high-frequency signal is increased. In other words, the magnetoresistive effect element 1a is capable of being considered as a resistance element in which the impedance of the high-frequency signal is increased at the spin torque resonance frequency due to the spin torque resonance phenomenon.

The spin torque resonance frequency varies with the effective magnetic field in the magnetization free layer 4. An effective magnetic field $H_{\it eff}$ in the magnetization free layer 4 is represented by the following equation:

$$H_{\it eff}=H_E+H_k+H_D+H_{EX}$$

where $H_E$ denotes an external magnetic field to be applied to the magnetization free layer 4, $H_k$ denotes an anisotropy magnetic field in the magnetization free layer 4, $H_D$ denotes a demagnetizing field in the magnetization free layer 4, and $H_{EX}$ denotes an exchange coupling magnetic field in the magnetization free layer 4. The magnetic-field applying mechanism 12 is an effective magnetic field setting mechanism that is capable of setting the effective magnetic field $H_{\it eff}$ in the magnetization free layer 4 by applying the magnetic field to the magnetoresistive effect element 1a and applying the external magnetic field $H_E$ to the magnetization free layer 4. The magnetic-field applying mechanism 12, which is the effective magnetic field setting mechanism, varies the effective magnetic field in the magnetization free layer 4 by varying the magnetic field to be applied to the magnetoresistive effect element 1a to enable the spin torque resonance frequency of the magnetization free layer 4 to be varied. As described above, varying the magnetic field to be applied to the magnetoresistive effect element 1a varies the spin torque resonance frequency.

The application of the direct current to the magnetoresistive effect element 1a in the spin torque resonance increases the spin torque to increase the amplitude of the oscillating resistance value. The increase in the amplitude of the oscillating resistance value increases the amount of change in element impedance of the magnetoresistive effect element 1a. Varying the current density of the applied direct current varies the spin torque resonance frequency. Accordingly, the spin torque resonance frequency of the magnetoresistive effect element 1a is capable of being varied by varying the magnetic field from the magnetic-field applying mechanism 12 or by varying the direct current applied from the direct-current input terminal 11. The current density of the direct current to be applied to the magnetoresistive effect element 1a is preferably smaller than an oscillation threshold current density of the magnetoresistive effect element 1a. The oscillation threshold current density of the magnetoresistive effect element means the current density at a threshold value at which the magnetoresistive effect element oscillates at start of precession of the magnetization of the magnetization free layer in the magnetoresistive effect element at a constant frequency and at a constant amplitude (the output (the resistance value) of the magnetoresistive effect element is varied at a constant frequency and at a constant amplitude) in response to application of the direct current having a current density higher than or equal to the oscillation threshold current density.

Due to the spin torque resonance phenomenon, the frequency components that coincide with the spin torque resonance frequency of the magnetoresistive effect element 1a or that are near the spin torque resonance frequency of the magnetoresistive effect element 1a, among the high-frequency components of the high-frequency signal input through the first port 9a, are cut off by the magnetoresistive effect element 1a in a high impedance state and it is difficult to supply the frequency components to the second port 9b. The magnetoresistive effect device 100 may function as a high-frequency filter using the frequencies near the spin torque resonance frequency as a cutoff frequency band in the above manner. In other words, the magnetoresistive effect device 100 is a band stop filter (band elimination filter).

Figure 2:
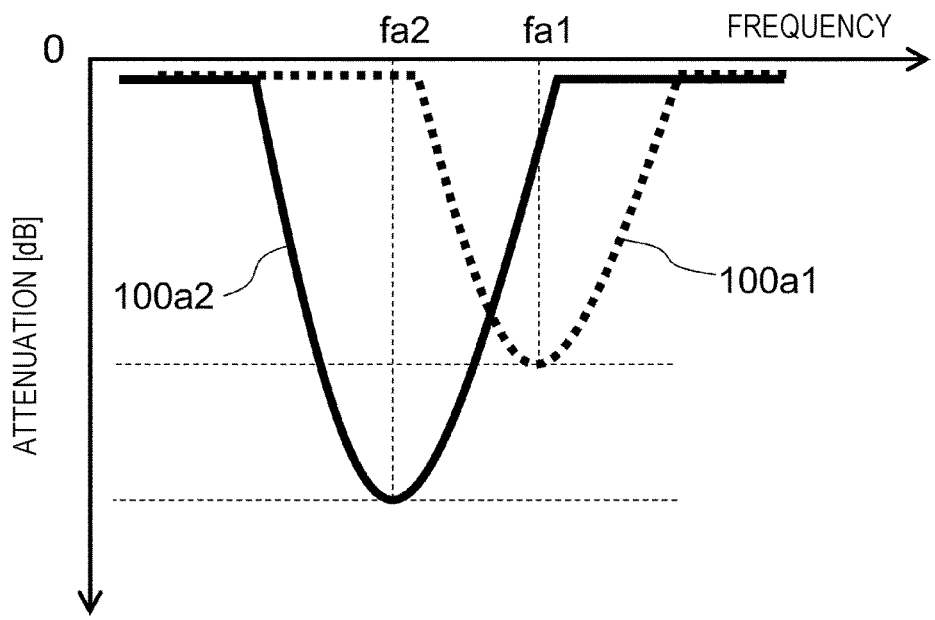
FIG. 2 is a graph illustrating the relationship between frequency and attenuation for direct current in the magnetoresistive effect device according to the first embodiment.
Figure 3:
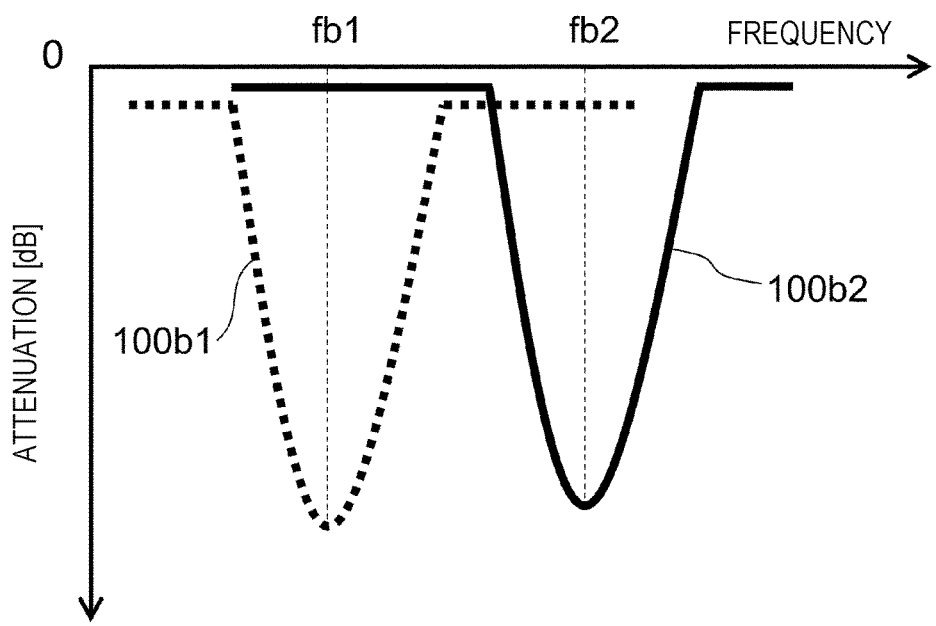
FIG. 3 is a graph illustrating the relationship between frequency and attenuation for the strength of a magnetic field in the magnetoresistive effect device according to the first embodiment.

FIG. 2 and FIG. 3 are graphs each illustrating the relationship between the frequency of the high-frequency signal input into the magnetoresistive effect device 100 and the attenuation. Referring to FIG. 2 and FIG. 3, the vertical axis represents attenuation and the horizontal axis represents frequency. FIG. 2 is a graph when a constant magnetic field is applied to the magnetoresistive effect element 1a. Referring to FIG. 2, a plot line 100a1 represents the relationship between the frequency of the high-frequency signal and the attenuation when the direct current applied from the direct-current input terminal 11 to the magnetoresistive effect element 1a has a value of Ia1 and a plot line 100a2 represents the relationship between the frequency of the high-frequency signal and the attenuation when the direct current applied from the direct-current input terminal 11 to the magnetoresistive effect element 1a has a value of Ia2. The relationship between the applied direct current values is Ia1<Ia2. FIG. 3 is a graph when constant direct current is applied to the magnetoresistive effect element 1a. Referring to FIG. 3, a plot line 100b1 represents the relationship between the frequency of the high-frequency signal and the attenuation when the magnetic field applied from the magnetic-field applying mechanism 12 to the magnetoresistive effect element 1a has a strength of Hb1 and a plot line 100b2 represents the relationship between the frequency of the high-frequency signal and the attenuation when the magnetic field applied from the magnetic-field applying mechanism 12 to the magnetoresistive effect element 1a has the strength of Hb2. The relationship between the strengths of the magnetic fields is Hb1<Hb2.

For example, when the value of the direct current applied from the direct-current input terminal 11 to the magnetoresistive effect element 1a is increased from Ia1 to Ia2, as illustrated in FIG. 2, the amount of increase in element impedance at the frequencies near the spin torque resonance frequency of the magnetoresistive effect element 1a (the frequencies in the cutoff frequency band) is increased with the variation in the current value. As a result, the high-frequency signal output from the second port 9b is further reduced to increase the attenuation (the absolute value of the attenuation). Accordingly, the magnetoresistive effect device 100 is capable of realizing a high-frequency filter having a wide range of cut-off characteristics and bandpass characteristics. In response to the increase of the direct current value from Ia1 to Ia2, the spin torque resonance frequency of the magnetoresistive effect element 1a is shifted from fa1 to fa2. In other words, the cutoff frequency band is shifted toward low frequencies. Thus, the magnetoresistive effect device 100 may function as a high-frequency filter capable of varying the frequencies of the cutoff frequency band.

For example, when the strength of the magnetic field applied from the magnetic-field applying mechanism 12 is increased from Hb1 to Hb2, as illustrated in FIG. 3, the spin torque resonance frequency of the magnetoresistive effect element 1a is shifted from fb1 to fb2. Specifically, the cutoff frequency band is shifted toward high frequencies. The cutoff frequency band is capable of being greatly shifted when the strength of the magnetic field (the effective magnetic field $H_{eff}$ in the magnetization free layer 4) is varied, compared with the case in which the direct current value is varied. In other words, the magnetoresistive effect device 100 may function as a high-frequency filter capable of varying the frequencies of the cutoff frequency band.

The amplitude of the oscillating resistance value of the magnetoresistive effect element 1a is reduced with an increase in the external magnetic field $H_g$ to be applied to the magnetoresistive effect element 1a (the effective magnetic field $H_{eff}$ in the magnetization free layer 4). Accordingly, the current density of the direct current to be applied to the magnetoresistive effect element 1a is preferably increased with an increase in the external magnetic field $H_E$ to be applied to the magnetoresistive effect element 1a (the effective magnetic field $H_{eff}$ in the magnetization free layer 4).

As described above, the magnetoresistive effect device 100 includes the magnetoresistive effect element 1a including the magnetization fixed layer 2, the magnetization free layer 4, and the spacer layer 3 arranged between the magnetization fixed layer 2 and the magnetization free layer 4; the first port 9a; the second port 9b; the signal line 7; the inductor 10; and the direct-current input terminal 11. The first port 9a, the magnetoresistive effect element 1a, and the second port 9b are connected in series in this order via the signal line 7. The inductor 10 is connected to the signal line 7 between the magnetoresistive effect element 1a and the second port 9b (one of the signal line 7 between the magnetoresistive effect element 1a and the first port 9a and the signal line 7 between the magnetoresistive effect element 1a and the second port 9b) and is capable of being connected to the ground 8. The direct-current input terminal 11 is connected to the signal line 7 between the magnetoresistive effect element 1a and the first port 9a (the other of the signal line 7 between the magnetoresistive effect element 1a and the first port 9a and the signal line 7 between the magnetoresistive effect element 1a and the second port 9b). A closed circuit including the magnetoresistive effect element 1a, the signal line 7, the inductor 10, the ground 8, and the direct-current input terminal 11 is capable of being formed. The magnetoresistive effect element 1a is arranged so that the direct current supplied from the direct-current input terminal 11 flows through the magnetoresistive effect element 1a in the direction from the magnetization fixed layer 2 to the magnetization free layer 4.

Accordingly, the input of the high-frequency signal from the first port 9a to the magnetoresistive effect element 1a via the signal line 7 enables the spin torque resonance to be induced in the magnetoresistive effect element 1a. Due to the direct current flowing through the magnetoresistive effect element 1a in the direction from the magnetization fixed layer 2 to the magnetization free layer 4 simultaneously with the spin torque resonance, the magnetoresistive effect element 1a is capable of being considered as an element the resistance value of which oscillates with a fixed cycle at a frequency corresponding to the spin torque resonance frequency out of phase with the high-frequency signal input through the first port 9a by 180 degrees. With this effect, the element impedance of the magnetoresistive effect element 1a at a frequency equal to the spin torque resonance frequency is increased. The series connection of the first port 9a, the magnetoresistive effect element 1a, and the second port 9b in this order enables the high-frequency signal to be passed at a non-resonant frequency at which the magnetoresistive effect element 1a is in a low impedance state and to be cut off at a resonant frequency at which the magnetoresistive effect element 1a is in a high impedance state. In other words, the magnetoresistive effect device 100 is capable of having frequency characteristics as a high-frequency filter.

The inductor 10 connected to the signal line 7 and the ground 8 does not pass the high-frequency signal but selectively causes the direct current signal to flow to the ground. Accordingly, the direct current supplied from the direct-current input terminal 11 flows through the closed circuit including the magnetoresistive effect element 1a, the signal line 7, the inductor 10, the ground 8, and the direct-current input terminal 11. The closed circuit enables the direct current to be efficiently applied to the magnetoresistive effect element 1a. In response to the application of the direct current, the spin torque is increased and the amplitude of the oscillating resistance value is increased in the magnetoresistive effect element 1a. Since the increase in the amplitude of the oscillating resistance value increases the amount of change in element impedance of the magnetoresistive effect element 1a, the magnetoresistive effect device 100 may function as a high-frequency filter having a wide range of the cut-off characteristics and the bandpass characteristics.

In order to increase the range of the cut-off characteristics and the bandpass characteristics, the magnetoresistive effect device 100 preferably has a configuration in which the magnetization free layer 4 has the magnetic easy axis in the plane normal direction and the magnetization fixed layer 2 has the magnetic easy axis in the in-plane direction.

In addition, since varying the direct current applied from the direct-current input terminal 11 enables the spin torque resonance frequency of the magnetoresistive effect element 1a to be variably controlled, the magnetoresistive effect device 100 may function as a variable frequency filter.

Furthermore, since the magnetoresistive effect device 100 includes the magnetic-field applying mechanism 12 serving as the frequency setting mechanism capable of setting the spin torque resonance frequency of the magnetoresistive effect element 1a, the spin torque resonance frequency of the magnetoresistive effect element 1a is capable of being set to an arbitrary value. Accordingly, the magnetoresistive effect device 100 may function as a filter having an arbitrary frequency band.

Furthermore, the magnetic-field applying mechanism 12 is the effective magnetic field setting mechanism capable of setting the effective magnetic field in the magnetization free layer 4 and is capable of varying the spin torque resonance frequency of the magnetoresistive effect element 1a by varying the effective magnetic field in the magnetization free layer 4 in the magnetoresistive effect device 100. Accordingly, the magnetoresistive effect device 100 may function as the variable frequency filter.

Various components may be added to the magnetoresistive effect device 100 of the first embodiment described above. For example, in order to prevent the direct current signal from flowing into a high-frequency circuit connected to the first port 9a, a capacitor for cutting off the direct current signal may be connected in series to the signal line 7 between a connection portion to the signal line 7 of the direct-current input terminal 11 and the first port 9a. Alternatively, in order to prevent the direct current signal from flowing into a high-frequency circuit connected to the second port 9b, a capacitor for cutting off the direct current signal may be connected in series to the signal line 7 between a connection portion to the signal line 7 of the inductor 10 and the second port 9b.

Second Embodiment

Figure 4:
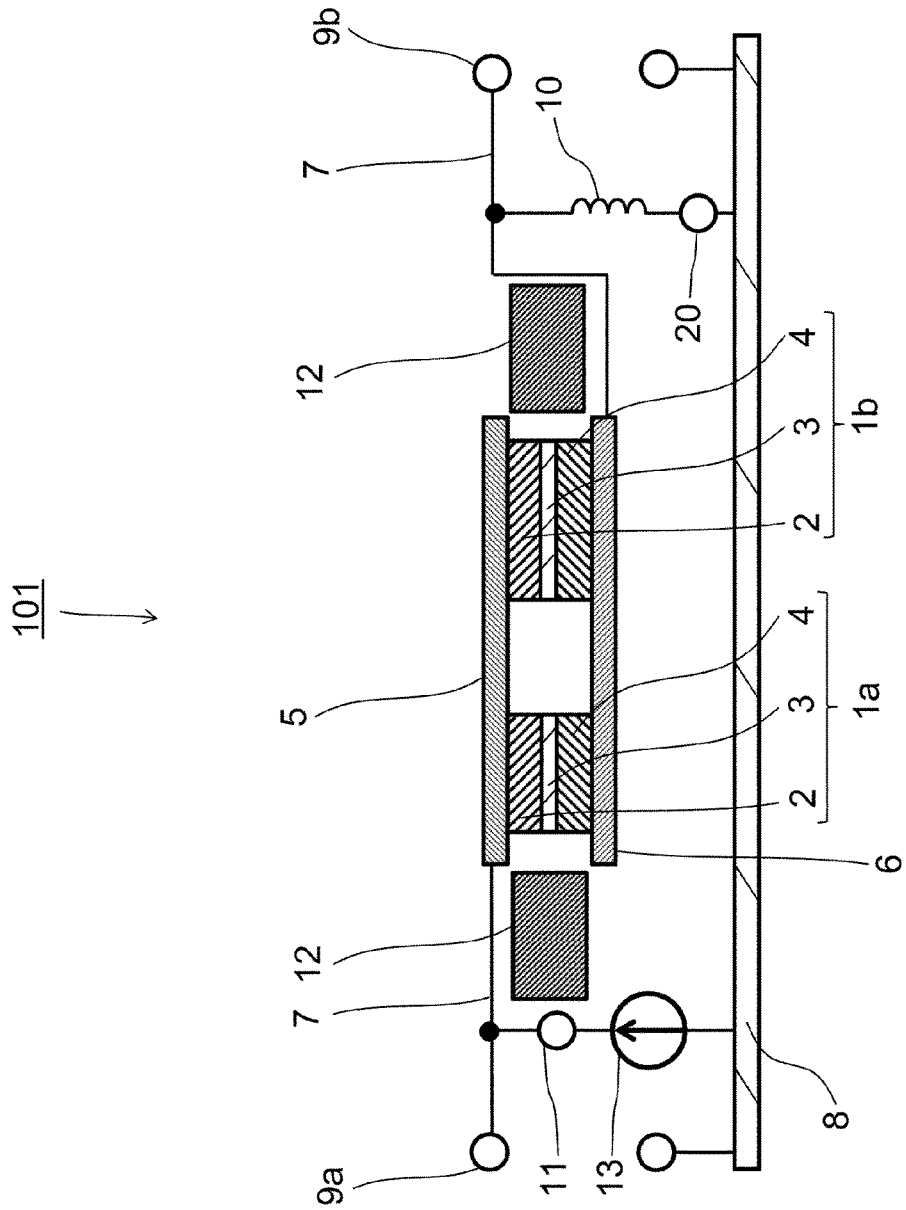
FIG. 4 is a schematic cross-sectional view of a magnetoresistive effect device according to a second embodiment.

FIG. 4 is a schematic cross-sectional view of a magnetoresistive effect device 101 according to a second embodiment of the present invention. Points different from the magnetoresistive effect device 100 of the first embodiment in the magnetoresistive effect device 101 will be mainly described and a description of common points will be appropriately omitted herein. The same reference numerals are used in the second embodiment to identify the same components in the magnetoresistive effect device 100 of the first embodiment and a description of the common components will be omitted herein. The magnetoresistive effect device 101 includes two magnetoresistive effect elements 1a and 1b each including the magnetization fixed layer 2, the spacer layer 3, and the magnetization free layer 4, the upper electrode 5, the lower electrode 6, the first port 9a, the second port 9b, the signal line 7, the inductor 10, the direct-current input terminal 11, and the magnetic-field applying mechanism 12 serving as the frequency setting mechanism. The magnetoresistive effect element 1a is connected in parallel to the magnetoresistive effect element 1b between the upper electrode 5 and the lower electrode 6. The first port 9a, the magnetoresistive effect element 1a or the magnetoresistive effect element 1b, and the second port 9b are connected in series in this order via the signal line 7. The magnetoresistive effect elements 1a and 1b have different spin torque resonance frequencies from each other in a state in which the same magnetic field and the direct current of the same current density are applied. More specifically, although the magnetoresistive effect elements 1a and 1b have the same film structure and have rectangular shapes in plan view, the plan view shape of the magnetoresistive effect element 1a is different from the plan view shape of the magnetoresistive effect element 1a in the aspect ratio. "The same film structure" means that the magnetoresistive effect elements have the same material and the same film thickness of each layer composing the magnetoresistive effect elements and have the same stacking order of the layers. "The plan view shape" means the shape of each of the magnetoresistive effect elements when the magnetoresistive effect element is viewed from above a plane perpendicular to the stacking direction of the respective layers composing the magnetoresistive effect element. "The aspect ratio" means the ratio of the length of the long sides to the length of the short sides of a rectangle circumscribed around the plan view shape of the magnetoresistive effect element with a minimum area.

The inductor 10 is connected to the signal line 7 between the magnetoresistive effect elements 1a and 1b, which are connected in parallel to each other, and the second port 9b (one of the signal line 7 between the magnetoresistive effect elements 1a and 1b and the first port 9a and the signal line 7 between the magnetoresistive effect elements 1a and 1b and the second port 9b) and is capable of being connected to the ground 8 via the reference voltage terminal 20. The direct-current input terminal 11 is connected to the signal line 7 between the magnetoresistive effect elements 1a and 1b, which are connected in parallel to each other, and the first port 9a (the other of the signal line 7 between the magnetoresistive effect elements 1a and 1b and the first port 9a and the signal line 7 between the magnetoresistive effect elements 1a and 1b and the second port 9b). In ether words, the direct-current input terminal 11 is connected to the signal line 7 at the opposite side to the inductor 10 with the magnetoresistive effect elements 1a and 1b in between the direct-current input terminal 11 and the inductor 10. A closed circuit including the magnetoresistive effect element 1a, the magnetoresistive effect element 1b, the signal line 7, the inductor 10, the ground 8, and the direct-current input terminal 11 is capable of being formed when the magnetoresistive effect device 101 is connected to the ground 8. More specifically, in the magnetoresistive effect device 101, the connection of the inductor 10 to the ground 8 via the reference voltage terminal 20 and the connection of the direct-current source 13 connected to the ground 8 to the direct-current input terminal 11 enable the closed circuit including the magnetoresistive effect element 1a, the magnetoresistive effect element 1b, the signal line 7, the inductor 10, the ground 8, and the direct-current input terminal 11 to be formed. The direct current supplied from the direct-current input terminal 11 flows through the closed circuit and is applied to the magnetoresistive effect element 1a and the magnetoresistive effect element 1b. The magnetoresistive effect element 1a and the magneto-resistive effect element 1b are arranged so that the direct current supplied from the direct-current input terminal 11 flows through the magnetoresistive effect element 1a and the magnetoresistive effect element 1b in the direction from the magnetization fixed layer 2 to the magnetization free layer 4.

The magnetization fixed layer 2 of the magnetoresistive effect element 1a and the magnetization fixed layer 2 of the magnetoresistive effect element 1b are connected to the same upper electrode 5. The magnetization free layer 4 of the magnetoresistive effect element 1a and the magnetization free layer 4 of the magnetoresistive effect element 1b are connected to the same lower electrode 6.

The magnetic-field applying mechanism 12 is disposed near the magnetoresistive effect elements 1a and 1b and simultaneously applies the same magnetic field to the magnetoresistive effect elements 1a and 1b. The magnetic-field applying mechanism 12 varies the effective magnetic fields in the magnetization free layers 4 in the magnetoresistive effect elements 1a and 1b by varying the magnetic fields to be applied to the magnetoresistive effect elements 1a and 1b to enable the spin torque resonance frequencies of the magnetoresistive effect elements 1a and 1b to be varied.

Figure 5:
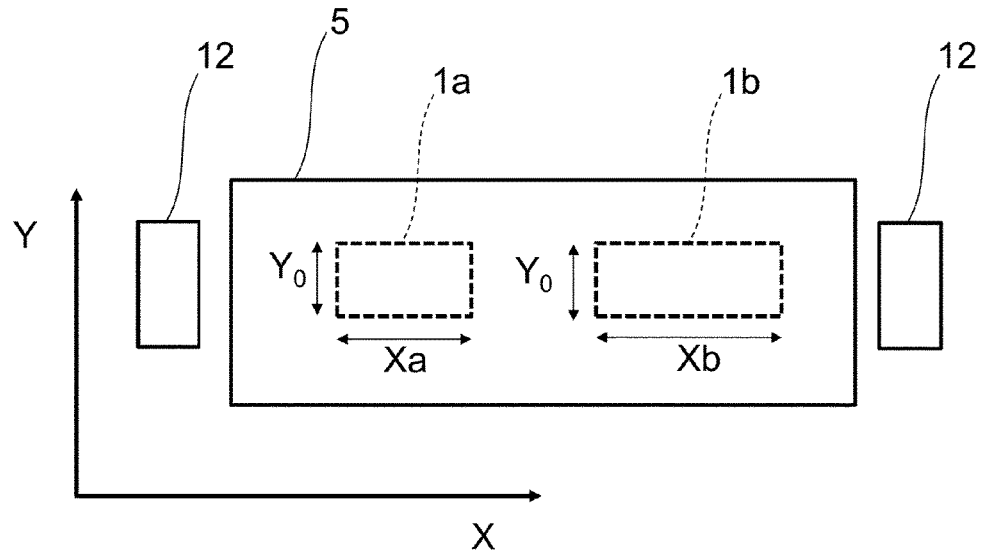
FIG. 5 is a top view of the magnetoresistive effect device according to the second embodiment.

The film structures of the magnetoresistive effect elements 1a and 1b are the same as the film structure of the magnetoresistive effect element 1a of the first embodiment. FIG. 5 is a top view of the magnetoresistive effect device 101. As illustrated in FIG. 5, the magnetoresistive effect elements 1a and 1b have the same dimension $Y_0$ in the Y direction, which is the direction of the short sides of the plan view shapes of the magnetoresistive effect elements 1a and 1b. However, a dimension Xa in the X direction, which is the direction of the long sides of the plan view shape of the magnetoresistive effect element 1a, is different from a dimension Xb in the X direction, which is the direction of the long sides of the plan view shape of the magnetoresistive effect element 1b, and Xa<Xb. Accordingly, the aspect ratio (Xb/Y$_0$) of the plan view shape of the magnetoresistive effect element 1b is higher than the aspect ratio (Xa/Y$_0$) of the plan view shape of the magnetoresistive effect element 1a. In consideration of a state in which the same magnetic field and the direct current of the same current density are applied to each magnetoresistive effect element, the spin torque resonance frequency of the magnetoresistive effect element is increased with an increase in aspect ratio of the plan view shape of the magnetoresistive effect element. As a result, a spin torque resonance frequency fb of the magnetoresistive effect element 1b is higher than a spin torque resonance frequency fa of the magnetoresistive effect element 1a. Since differentiating the aspect ratios of the plan view shapes of the multiple magnetoresistive effect elements in the above manner enables the spin torque resonance frequencies to be differentiated from each other even when the magnetoresistive effect elements have the same film structure, it is possible to manufacture the multiple magnetoresistive effect elements having different spin torque resonance frequencies from each other through the same film formation process. In other words, since the multiple magnetoresistive effect elements have the same film structure, it is possible to collectively form the films of the layers composing the multiple magnetoresistive effect elements.

Due to the spin torque resonance phenomenon, the frequency components that coincide with the spin torque resonance frequency of the magnetoresistive effect element 1a or the magnetoresistive effect element 1b or that are near the spin torque resonance frequency of the magnetoresistive effect element 1a or the magnetoresistive effect element 1b, among the high-frequency components of the high-frequency signal input through the first port 9a, are cut off by the magnetoresistive effect element 1a and the magnetoresistive effect element 1b, in which the combined impedance is in a high impedance state and which are connected in parallel to each other, and it is difficult to supply the frequency components to the second port 9b. The magnetoresistive effect device 101 may function as a high-frequency filter using the frequencies near the spin torque resonance frequency of the magnetoresistive effect element 1a or the magnetoresistive effect element 1b as the cutoff frequency band.

Figure 6:
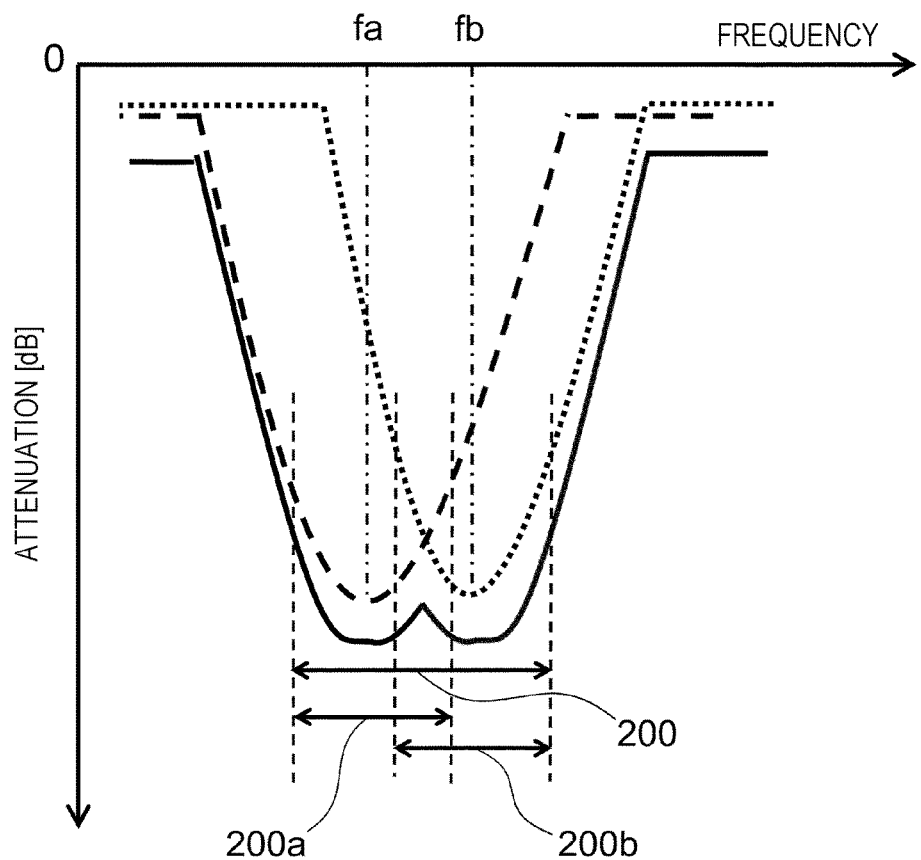
FIG. 6 is a graph illustrating the relationship between frequency and attenuation in the magnetoresistive effect device according to the second embodiment.

FIG. 6 is a graph illustrating the relationship between the frequency of the high-frequency signal input into the magnetoresistive effect device 101 and the attenuation. Referring to FIG. 6, the vertical axis represents attenuation and the horizontal axis represents frequency. As illustrated in FIG. 6, differentiating the aspect ratios of the plan view shapes of the magnetoresistive effect elements 1a and 1b from each other so that part of the frequencies near the spin torque resonance frequency fa of the magnetoresistive effect element 1a (a cutoff frequency band 200a illustrated in FIG. 6) is overlapped with part of the frequencies near the spin torque resonance frequency fb of the magnetoresistive effect element 1b (a cutoff frequency band 200b illustrated in FIG. 6) allows the magnetoresistive effect device 101 to have a cutoff frequency band (a cutoff frequency band 200 illustrated in FIG. 6) wider than that of the magnetoresistive effect device 100 of the first embodiment, as illustrated in FIG. 6.

In addition, varying the direct current to be applied to the magnetoresistive effect elements 1a and 1b or the strength of the magnetic field to be applied from the magnetic-field applying mechanism 12 to the magnetoresistive effect elements 1a and 1b enables the bandwidth of the magnetoresistive effect device 101 to be arbitrarily varied. Accordingly, the magnetoresistive effect device 101 may function as a variable frequency filter capable of arbitrarily varying the cutoff frequency band.

As described above, since the magnetoresistive effect elements 1a and 1b having different spin torque resonance frequencies from each other are connected in parallel to each other in the magnetoresistive effect device 101, the impedance of the multiple magnetoresistive effect elements near the multiple frequencies equal to the spin torque resonance frequencies of the respective magnetoresistive effect elements is increased and the cutoff frequency band 200 having a certain width is provided. In addition, varying the direct current or the magnetic field to be applied to the magnetoresistive effect elements enables the position of the cutoff frequency band to be varied. In other words, the magnetoresistive effect device 101 may function as a variable frequency filter capable of varying the position of the cutoff frequency band.

Furthermore, since the plan view shapes of the multiple magnetoresistive effect elements 1a and 1b have different aspect ratios from each other in the magnetoresistive effect device 101, it is possible to manufacture the multiple magnetoresistive effect elements 1a and 1b having different spin torque resonance frequencies from each other through the same process. Specifically, since the multiple magnetoresistive effect elements 1a and 1b have the same film structure in the magnetoresistive effect device 101, it is possible to collectively form the films of the layers composing the multiple magnetoresistive effect elements 1a and 1b, thereby reducing the manufacturing cost.

Although the two magnetoresistive effect elements 1a and 1b having different spin torque resonance frequencies from each other are connected in parallel in the magnetoresistive effect device 101 of the second embodiment, three or more magnetoresistive effect elements having different spin torque resonance frequencies from each other may be connected in parallel. The width of the cutoff frequency band is further increased in this case.

Although the two magnetoresistive effect elements 1a and 1b have the same film structure in the magnetoresistive effect device 101 of the second embodiment, the multiple magnetoresistive effect elements may have different film structures. In this case, the different film structures may be used while the aspect ratios of the plan view shapes of the multiple magnetoresistive effect elements are made equal to each other to differentiate the spin torque resonance frequencies of the multiple magnetoresistive effect elements from each other.

Although the same magnetic field is simultaneously applied to the magnetoresistive effect elements 1a and 1b by the magnetic-field applying mechanism 12 in the magnetoresistive effect device 101 of the second embodiment, magnetic-field applying mechanisms for individually applying the magnetic fields to the respective magnetoresistive effect elements may be provided.

Third Embodiment

Figure 7:
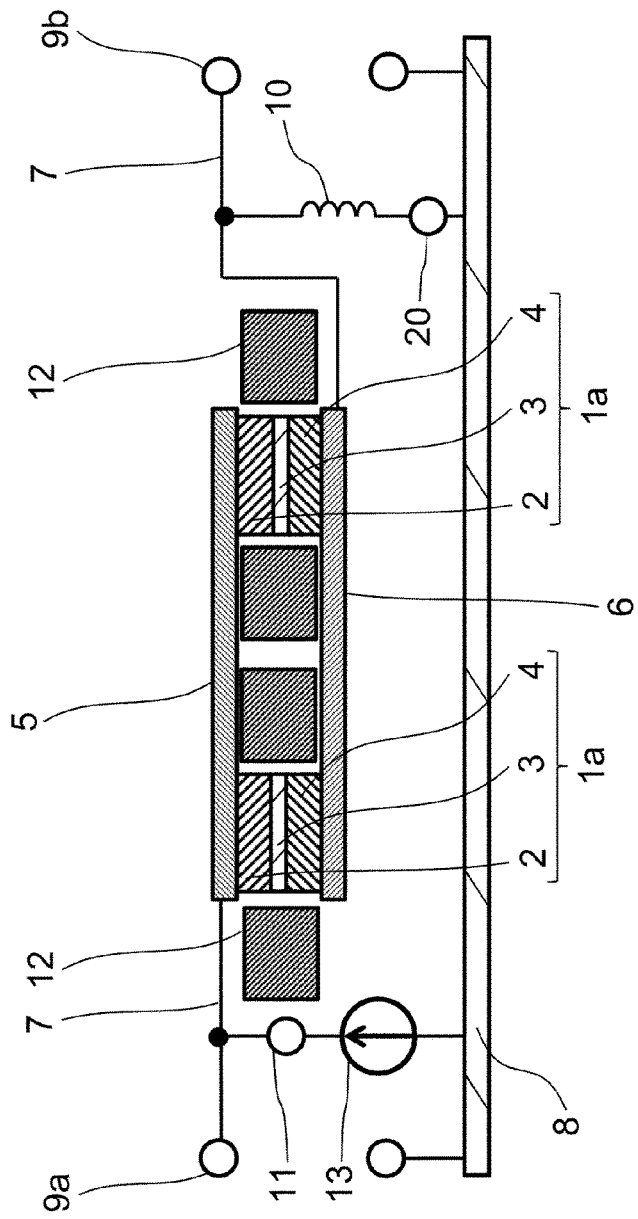
FIG. 7 is a schematic cross-sectional view of a magnetoresistive effect device according to a third embodiment.

FIG. 7 is a schematic cross-sectional view of a magnetoresistive effect device 102 according to a third embodiment of the present invention. Points different from the magnetoresistive effect device 100 of the first embodiment in the magnetoresistive effect device 102 will be mainly described and a description of common points will be appropriately omitted herein. The same reference numerals are used in the third embodiment to identify the same components in the magnetoresistive effect device 100 of the first embodiment and a description of the common components will be omitted herein. The magnetoresistive effect device 102 includes two magnetoresistive effect elements 1a each including the magnetization fixed layer 2, the spacer layer 3, and the magnetization free layer 4, the upper electrode 5, the lower electrode 6, the first port 9a, the second port 9b, the signal line 7, the inductor 10, the direct-current input terminal 11, and magnetic-field applying mechanisms 12 serving as two frequency setting mechanisms. The two magnetoresistive effect elements 1a have the same configuration and are connected in parallel to each other between the upper electrode 5 and the lower electrode 6. The first port 9a, the two magnetoresistive effect elements 1a connected in parallel to each other, and the second port 9b are connected in series in this order via the signal line 7. The respective magnetic-field applying mechanisms 12 apply individual magnetic fields to the corresponding magnetoresistive effect elements 1a. As described above, the magnetoresistive effect device 102 includes the two magnetic-field applying mechanisms 12 so as to individually set the spin torque resonance frequencies of the two respective magnetoresistive effect elements 1a. The inductor 10 is connected to the signal line 7 between the two magnetoresistive effect elements 1a, which are connected in parallel to each other, and the second port 9b (one of the signal line 7 between the two magnetoresistive effect elements 1a and the first port 9a and the signal line 7 between the two magnetoresistive effect elements 1a and the second port 9b) and is capable of being connected to the ground 8 via the reference voltage terminal 20. The direct-current input terminal 11 is connected to the signal line 7 between the two magnetoresistive effect elements 1a, which are connected in parallel to each other, and the first port 9a (the other of the signal line 7 between the two magnetoresistive effect elements 1a and the first port 9a and the signal line 7 between the two magnetoresistive effect elements 1a and the second port 9b). In other words, the direct-current input terminal 11 is connected to the signal line 7 at the opposite side to the inductor 10 with the two magnetoresistive effect elements 1a, which are connected in parallel to each other, in between the direct-current input terminal 11 and the inductor 10. A closed circuit including the two magnetoresistive effect elements 1a, the signal line 7, the inductor 10, the ground 8, and the direct-current input terminal 11 is capable of being formed when the magnetoresistive effect device 102 is connected to the ground 8. More specifically, in the magnetoresistive effect device 102, the connection of the inductor 10 to the ground 8 via the reference voltage terminal 20 and the connection of the direct-current source 13 connected to the ground 8 to the direct-current input terminal 11 enable the closed circuit including the magnetoresistive effect elements 1a, the signal line 7, the inductor 10, the ground 8, and the direct-current input terminal 11 to be formed. The direct current supplied from the direct-current input terminal 11 flows through the closed circuit and is applied to the two magnetoresistive effect elements 1a.

The magnetization fixed layers 2 of the two magnetoresistive effect elements 1a are connected to the same upper electrode 5. The magnetization free layers 4 of the two magnetoresistive effect elements 1a are connected to the same lower electrode 6.

In the magnetoresistive effect device 102, the high-frequency signal is supplied to the two magnetoresistive effect elements 1a via the signal line 7 in a state in which the magnetic fields are individually applied from the respective magnetic-field applying mechanisms 12 to the corresponding magnetoresistive effect elements 1a. For example, the strength of the magnetic field to be applied to one of the magnetoresistive effect elements 1a is made smaller than the strength of the magnetic field to be applied to the other of the magnetoresistive effect elements 1a. The spin torque resonance frequencies of the two magnetoresistive effect elements 1a are different from each other in this case.

Due to the spin torque resonance phenomenon, the frequency components that coincide with the spin torque resonance frequency of either of the two magnetoresistive effect elements 1a or that are near the spin torque resonance frequency of either of the two magnetoresistive effect elements 1a, among the high-frequency components of the high-frequency signal input through the first port 9a, are out off by the two magnetoresistive effect elements 1a, in which the combined impedance is in a high impedance state and which are connected in parallel to each other, and it is difficult to supply the frequency components to the second port 9b. The magnetoresistive effect device 102 may function as a high-frequency filter using the frequencies near the spin torque resonance frequency of either of the two magnetoresistive effect elements 1a as the cutoff frequency band.

Figure 8:
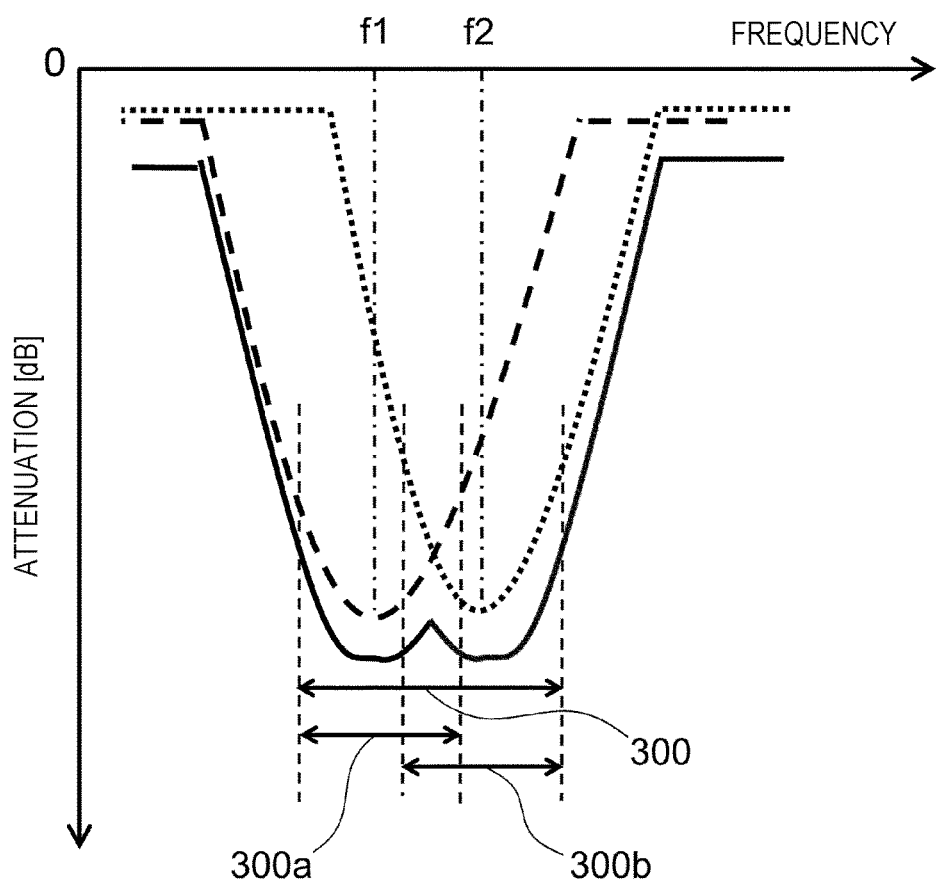
FIG. 8 is a graph illustrating the relationship between frequency and attenuation in the magnetoresistive effect device according to the third embodiment.

FIG. 8 is a graph illustrating the relationship between the frequency of the high-frequency signal input into the magnetoresistive effect device 102 and the attenuation. Referring to FIG. 8, the vertical axis represents attenuation and the horizontal axis represents frequency. For example, as illustrated in FIG. 8, when the magnetic field to be applied to one of the magnetoresistive effect elements 1a is made smaller than the magnetic field to be applied to the other of the magnetoresistive effect elements 1a, f1<f2 where f1 denotes the spin torque resonance frequency of one of the magnetoresistive effect elements 1a and f2 denotes the spin torque resonance frequency of the other of the magnetoresistive effect elements 1a. Accordingly, as illustrated in FIG. 8, adjusting the strength of the magnetic field to be applied from each of the magnetic-field applying mechanisms 12 to the corresponding magnetoresistive effect element 1a so that part of the frequencies near the spin torque resonance frequency f1 of one of the magnetoresistive effect elements 1a (a cutoff frequency band 300a illustrated in FIG. 8) is overlapped with part of the frequencies near the spin torque resonance frequency f2 of the other of the magnetoresistive effect elements 1a (a cutoff frequency band 300b illustrated in FIG. 8) allows the magnetoresistive effect device 102 to have a cutoff frequency band (a cutoff frequency band 300 illustrated in FIG. 8) wider than that of the magnetoresistive effect device 100 of the first embodiment, as illustrated in FIG. 8.

In addition, varying the direct current to be applied to each of the magnetoresistive effect elements 1a or the strength of the magnetic field to be applied from each of the magnetic-field applying mechanisms 12 to the corresponding magnetoresistive effect element 1a enables the bandwidth of the magnetoresistive effect device 102 to be arbitrarily varied. Accordingly, the magnetoresistive effect device 102 may function as a variable frequency filter capable of arbitrarily varying the cutoff frequency band.

As described above, since the magnetoresistive effect device 102 includes the multiple magnetic-field applying mechanisms 12 serving as the frequency setting mechanisms so as to individually set the spin torque resonance frequencies of the respective multiple magnetoresistive effect elements 1a, the magnetoresistive effect device 102 is capable of individually controlling the spin torque resonance frequencies of the respective magnetoresistive effect elements 1a. In addition, since the multiple magnetoresistive effect elements 1a are connected in parallel to each other, the impedance of the multiple magnetoresistive effect elements near the multiple frequencies equal to the spin torque resonance frequencies of the respective magnetoresistive effect elements 1a is increased and the cutoff frequency band 300 having a certain width is provided. Furthermore, varying the direct current or the magnetic field to be applied to each of the magnetoresistive effect elements 1a enables the bandwidth of the magnetoresistive effect device 102 to be arbitrarily varied. Accordingly, the magnetoresistive effect device 102 may function as a variable frequency filter capable of arbitrarily varying the cutoff frequency band.

Furthermore, although the two magnetoresistive effect elements 1a are connected in parallel to each other and the two frequency setting mechanisms (the two magnetic-field applying mechanisms 12) are provided so as to individually set the spin torque resonance frequencies of the respective magnetoresistive effect elements 1a in the magnetoresistive effect device 102 of the third embodiment, three or more magnetoresistive effect elements 1a may be connected in parallel to each other and three or more frequency setting mechanisms (three or more magnetic-field applying mechanisms 12) may be provided so as to individually set the spin torque resonance frequencies of the respective magnetoresistive effect elements 1a. The width of the cutoff frequency band is further increased in this case.

Furthermore, although the two magnetoresistive effect elements 1a have the same configuration in the magnetoresistive effect device 102 of the third embodiment, the multiple magnetoresistive effect elements may have different configurations.

Fourth Embodiment

Figure 9:
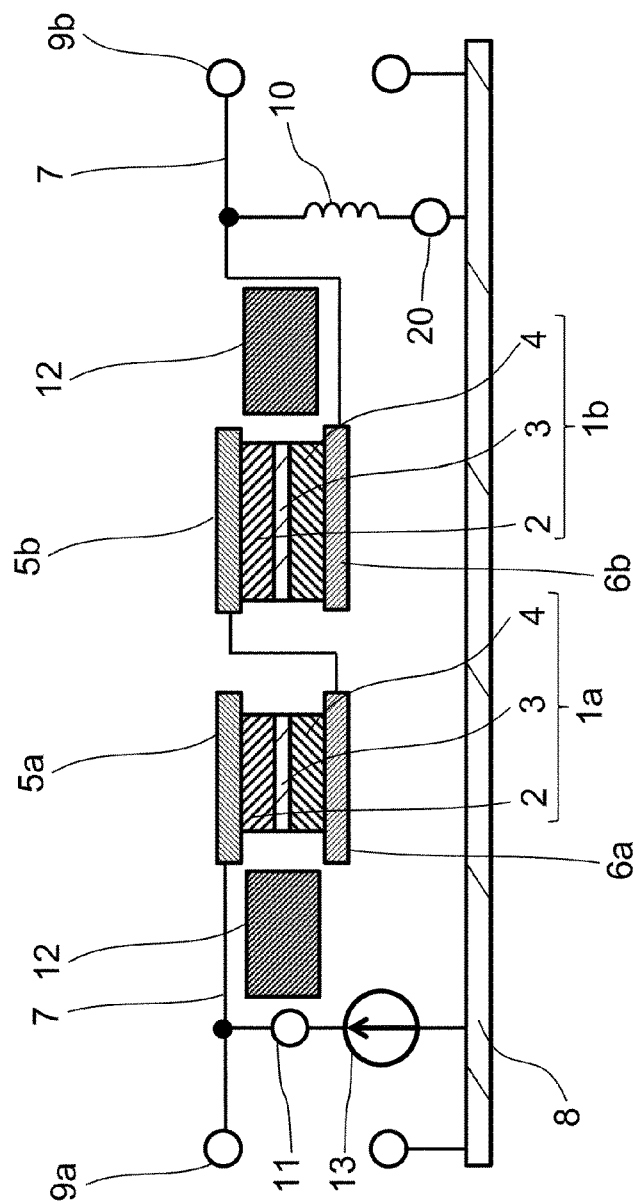
FIG. 9 is a schematic cross-sectional view of a magnetoresistive effect device according to a fourth embodiment.

FIG. 9 is a schematic cross-sectional view of a magnetoresistive effect device 103 according to a fourth embodiment of the present invention. Points different from the magnetoresistive effect device 100 of the first embodiment in the magnetoresistive effect device 103 will be mainly described and a description of common points will be appropriately omitted herein. The same reference numerals are used in the fourth embodiment to identify the same components in the magnetoresistive effect device 100 of the first embodiment and a description of the common components Will be omitted herein. The magnetoresistive effect device 103 includes the two magnetoresistive effect elements 1a and 1b each including the magnetization fixed layer 2, the spacer layer 3, and the magnetization free layer 4, upper electrodes 5a and 5b, lower electrodes 6a and 6b, the first port 9a, the second port 9b, the signal line 7, the inductor 10, the direct-current input terminal 11, and the magnetic-field applying mechanism 12 serving as the frequency setting mechanism. The upper electrode 5a and the lower electrode 6a are arranged so as to sandwich the magnetoresistive effect element 1a therebetween and the upper electrode 5b and the lower electrode 6b are arranged so as to sandwich the magnetoresistive effect element 1b therebetween. The magnetoresistive effect element 1a is connected in series to the magnetoresistive effect element 1b. The first port 9a, the magnetoresistive effect element 1a, the magnetoresistive effect element 1b, and the second port 9b are connected in series in this order via the signal line 7. The magnetoresistive effect elements 1a and 1b have different spin torque resonance frequencies from each other in a state in which the same magnetic field and the direct current of the same current density are applied. More specifically, although the magnetoresistive effect elements 1a and 1b have the same film structure and have rectangular shapes in plan view, the plan view shape of the magnetoresistive effect element 1a is different from the plan view shape of the magnetoresistive effect element 1a in the aspect ratio. "The same film structure" means that the magnetoresistive effect elements 1a and 1b have the same material and the same film thickness of each layer composing the magnetoresistive effect elements and have the same stacking order of the layers. "The plan view shape" means the shape of each of the magnetoresistive effect elements when the magnetoresistive effect element is viewed from above a plane perpendicular to the stacking direction of the respective layers composing the magnetoresistive effect element. "The aspect ratio" means the ratio or the length of the long sides to the length of the short sides of a rectangle circumscribed around the plan view shape of the magnetoresistive effect element with a minimum area.

The inductor 10 is connected to the signal line 7 between the magnetoresistive effect element 1b and the second port 9b (one of the signal line 7 between the magnetoresistive effect elements 1a and 1b and the first port 9a and the signal line 7 between the magnetoresistive effect elements 1a and 1b and the second port 9b) and is capable of being connected to the ground 8 via the reference voltage terminal 20. The direct-current input terminal 11 is connected to the signal line 7 between the magnetoresistive effect elements 1a and 1b, which are connected in series to each other, and the first port 9a (the other of the signal line 7 between the magnetoresistive effect elements 1a and 1b and the first port 9a and the signal line 7 between the magnetoresistive effect elements 1a and 1b and the second port 9b). In other words, the direct-current input terminal 11 is connected to the signal line 7 at the opposite side to the inductor 10 with the magnetoresistive effect elements 1a and 1b in between the direct-current input terminal 11 and the inductor 10. A closed circuit including the magnetoresistive effect element 1a, the magnetoresistive effect element 1b, the signal line 7, the inductor 10, the ground 8, and the direct-current input terminal 11 is capable of being formed when the magnetoresistive effect device 103 is connected to the ground 8. More specifically, in the magnetoresistive effect device 103, the connection of the inductor 10 to the ground 8 via the reference voltage terminal 20 and the connection of the direct-current source 13 connected to the ground 8 to the direct-current input terminal 11 enable the closed circuit including the magnetoresistive effect element 1a, the magnetoresistive effect element 1b, the signal line 7, the inductor 10, the ground 8, and the direct-current input terminal 11 to be formed. The direct current supplied from the direct-current input terminal 11 flows through the closed circuit and is applied to the magnetoresistive effect element 1a and the magnetoresistive effect element 1b. The magnetoresistive effect element 1a and the magnetoresistive effect element 1b are arranged so that the direct current supplied from the direct-current input terminal 11 flows through the magnetoresistive effect element 1a and the magnetoresistive effect element 1b in the direction from the magnetization fixed layer 2 to the magnetization free layer 4.

The lower electrode 6a to which the magnetization free layer 4 of the magnetoresistive effect element 1a is connected is electrically connected to the upper electrode 5b to which the magnetization fixed layer 2 of the magnetoresistive effect element 1b is connected. The magnetoresistive effect elements 1a and 1b are connected in series to each other.

The magnetic-field applying mechanism 12 is disposed near the magnetoresistive effect elements 1a and 1b and simultaneously applies the same magnetic field to the magnetoresistive effect elements 1a and 1b. The magnetic-field applying mechanism 12 varies the effective magnetic fields in the magnetization free layers 4 in the magnetoresistive effect elements 1a and 1b by varying the magnetic fields to be applied to the magnetoresistive effect elements 1a and 1b to enable the spin torque resonance frequencies of the magnetoresistive effect elements 1a and 1b to be varied.

Figure 10:
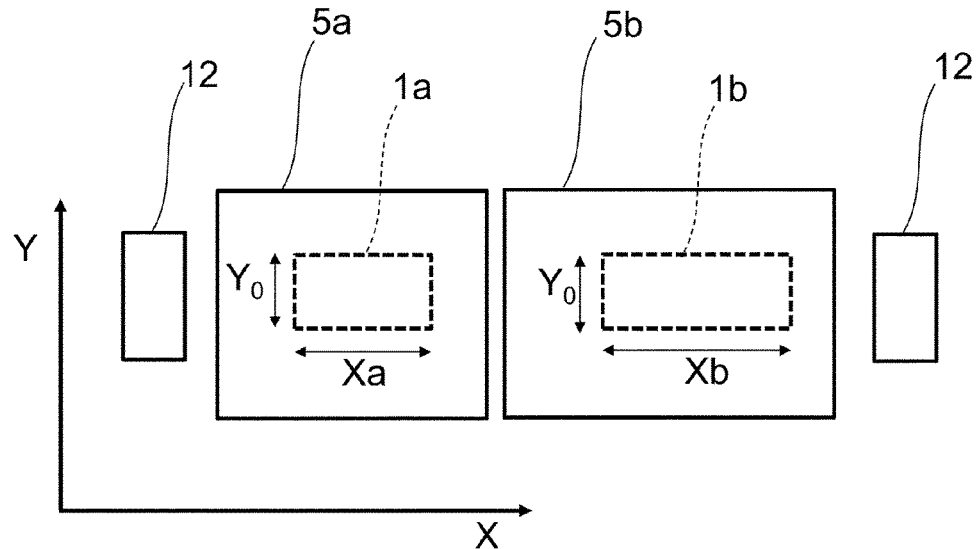
FIG. 10 is a top view of the magnetoresistive effect device according to the fourth embodiment.

The film structures of the magnetoresistive effect elements 1a and 1b are the same as the film structure of the magnetoresistive effect element 1a of the first embodiment. FIG. 10 is a top view of the magnetoresistive effect device 103. As illustrated in FIG. 10, the magnetoresistive effect elements 1a and 1b have the same dimension $Y_0$ in the Y direction, which is the direction of the short sides of the plan view shapes of the magnetoresistive effect elements 1a and 1b. However, the dimension Xa in the X direction, which is the direction of the long sides of the plan view shape of the magnetoresistive effect element 1a, is different from the dimension Xb in the X direction, which is the direction of the long sides of the plan view shape of the magnetoresistive effect element 1b, and Xa<Xb. Accordingly, the aspect ratio $(Xb/Y_0)$ of the plan view shape of the magnetoresistive effect element 1b is higher than the aspect ratio $(Xa/Y_0)$ of the plan view shape of the magnetoresistive effect element 1a. In consideration of the state in which the same magnetic field and the direct current of the same current density are applied to each magnetoresistive offset element, the spin torque resonance frequency of the magnetoresistive effect element is increased with an increase in aspect ratio of the plan view shape of the magnetoresistive effect element. As a result, the spin torque resonance frequency fb of the magnetoresistive effect element 1b is higher than the spin torque resonance frequency fa of the magnetoresistive effect element 1a. Since differentiating the aspect ratios of the plan view shapes of the multiple magnetoresistive effect elements in the above manner enables the spin torque resonance frequencies to be differentiated from each other even when the magnetoresistive effect elements have the same film structure, it is possible to manufacture the multiple magnetoresistive effect elements having different spin torque resonance frequencies from each other through the same film formation process. In other words, since the multiple magnetoresistive effect elements have the same film structure, it is possible to collectively form the films of the layers composing the multiple magnetoresistive effect elements. In addition, in the magnetoresistive effect device 103, since the magnetoresistive effect elements 1a and 1b are connected in series to each other and the area of the cross section of the magnetoresistive effect element 1a in a direction perpendicular to the direction in which the direct current flows is smaller than the area of the cross section of the magnetoresistive effect element 1b in the direction, the current density of the direct current applied to the magnetoresistive effect element 1a is higher than that of the direct current applied to the magnetoresistive effect element 1b. Accordingly, when the spin torque resonance frequency of the magnetoresistive effect element is decreased with an increase in the current density of the applied direct current or when the effect of the difference in the aspect ratio of the plan view shape of the magnetoresistive effect element on the spin torque resonance frequency of the magnetoresistive effect element is greater than the effect of the difference in the current density of the applied direct current on the spin torque resonance frequency of the magnetoresistive effect element, the plan view shape of the magnetoresistive effect element 1a is different from the plan view shape of the magnetoresistive effect element 1b in the aspect ratio and fa<fb.

Due to the spin torque resonance phenomenon, the frequency components that coincide with the spin torque resonance frequency of the magnetoresistive effect element 1a or the magnetoresistive effect element 1b or that are near the spin torque resonance frequency of the magnetoresistive effect element 1a or the magnetoresistive effect element 1b, among the high-frequency components of the high-frequency signal input through the first port 9a, are cut off by the magnetoresistive effect element 1a and the magnetoresistive effect element 1b, in which the combined impedance is in a high impedance state and which are connected in series to each other, and it is difficult to supply the frequency components to the second port 9b. The magnetoresistive effect device 103 may function as a high-frequency filter using the frequencies near the spin torque resonance frequency of the magnetoresistive effect element 1a or the magnetoresistive effect element 1b as the cutoff frequency band.

Figure 11:
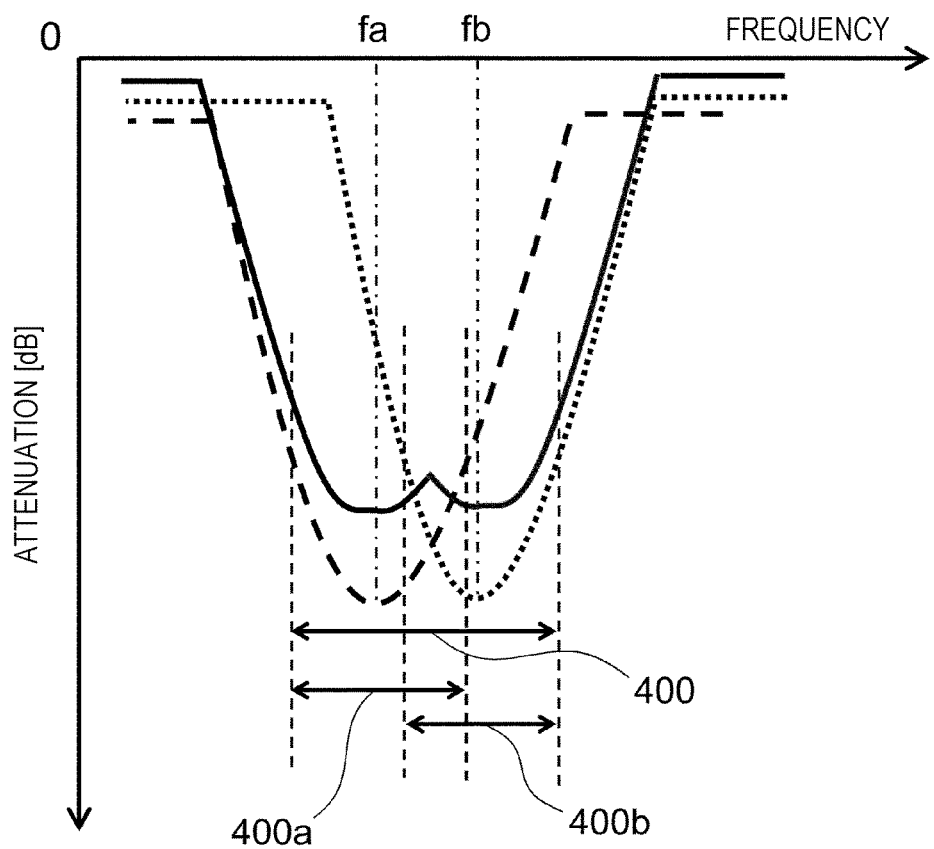
FIG. 11 is a graph illustrating the relationship between frequency and attenuation in the magnetoresistive effect device according to the fourth embodiment.

FIG. 11 is a graph illustrating the relationship between the frequency of the high-frequency signal input into the magnetoresistive effect device 103 and the attenuation. Referring to FIG. 11, the vertical axis represents attenuation and the horizontal axis represents frequency. As illustrated in FIG. 11, differentiating the aspect ratios of the plan view shapes of the magnetoresistive effect elements 1a and 1b from each other so that part of the frequencies near the spin torque resonance frequency fa of the magnetoresistive effect element 1a (a cutoff frequency band 400a illustrated in FIG. 11) is overlapped with part of the frequencies near the spin torque resonance frequency fb of the magnetoresistive effect element 1b (a cutoff frequency band 400b illustrated in FIG. 11) allows the magnetoresistive effect device 103 to have a cutoff frequency band (a cutoff frequency band 400 illustrated in FIG. 11) wider than that of the magnetoresistive effect device 100 of the first embodiment, as illustrated in FIG. 11.

In addition, varying the direct current to be applied to the magnetoresistive effect elements 1a and 1b or the strength of the magnetic field to be applied from the magnetic-field applying mechanism 12 to the magnetoresistive effect elements 1a and 1b enables the bandwidth of the magnetoresistive effect device 103 to be arbitrarily varied. Accordingly, the magnetoresistive effect device 103 may function as a variable frequency filter capable of arbitrarily varying the cutoff frequency band.

As described above, since the multiple magnetoresistive effect elements 1a and 1b having different spin torque resonance frequencies from each other are connected in series to each other in the magnetoresistive effect device 103, the impedance of the multiple magnetoresistive effect elements near the multiple frequencies equal to the spin torque resonance frequencies of the respective magnetoresistive effect elements is increased and the cutoff frequency band 400 having a certain width is provided. In addition, varying the direct current or the magnetic field to be applied to the magnetoresistive effect elements enables the position of the cutoff frequency band to be varied. In other words, the magnetoresistive effect device 103 may function as a variable frequency filter capable of varying the position of the cutoff frequency band.

Furthermore, since the plan view shapes of the multiple magnetoresistive effect elements 1a and 1b have different aspect ratios from each other in the magnetoresistive effect device 103, it is possible to manufacture the multiple magnetoresistive effect elements 1a and 1b having different spin torque resonance frequencies from each other through the same process. Specifically, since the multiple magnetoresistive effect elements 1a and 1b have the same film structure in the magnetoresistive effect device 103, it is possible to collectively form the films of the layers composing the multiple magnetoresistive effect elements 1a and 1b, thereby reducing the manufacturing cost.

Although the two magnetoresistive effect elements 1a and 1b having different spin torque resonance frequencies from each other are connected in series to each other in the magnetoresistive effect device 103 of the fourth embodiment, three or more magnetoresistive effect elements having different spin torque resonance frequencies from each other may be connected in series to each other. The width of the cutoff frequency band is further increased in this case.

Although the two magnetoresistive effect elements 1a and 1b have the same film structure in the magnetoresistive effect device 103 of the fourth embodiment, the multiple magnetoresistive effect elements may have different film structures. In this case, the different film structures may be used while the aspect ratios of the plan view shapes of the multiple magnetoresistive effect elements are made equal to each other to differentiate the spin torque resonance frequencies of the multiple magnetoresistive effect elements from each other.

Although the same magnetic field is simultaneously applied to the magnetoresistive effect elements 1a and 1b by the magnetic-field applying mechanism 12 in the magnetoresistive effect device 103 of the fourth embodiment, magnetic-field applying mechanisms for individually applying the magnetic fields to the respective magnetoresistive effect elements may be provided, as in the third embodiment.

Fifth Embodiment

Figure 12:
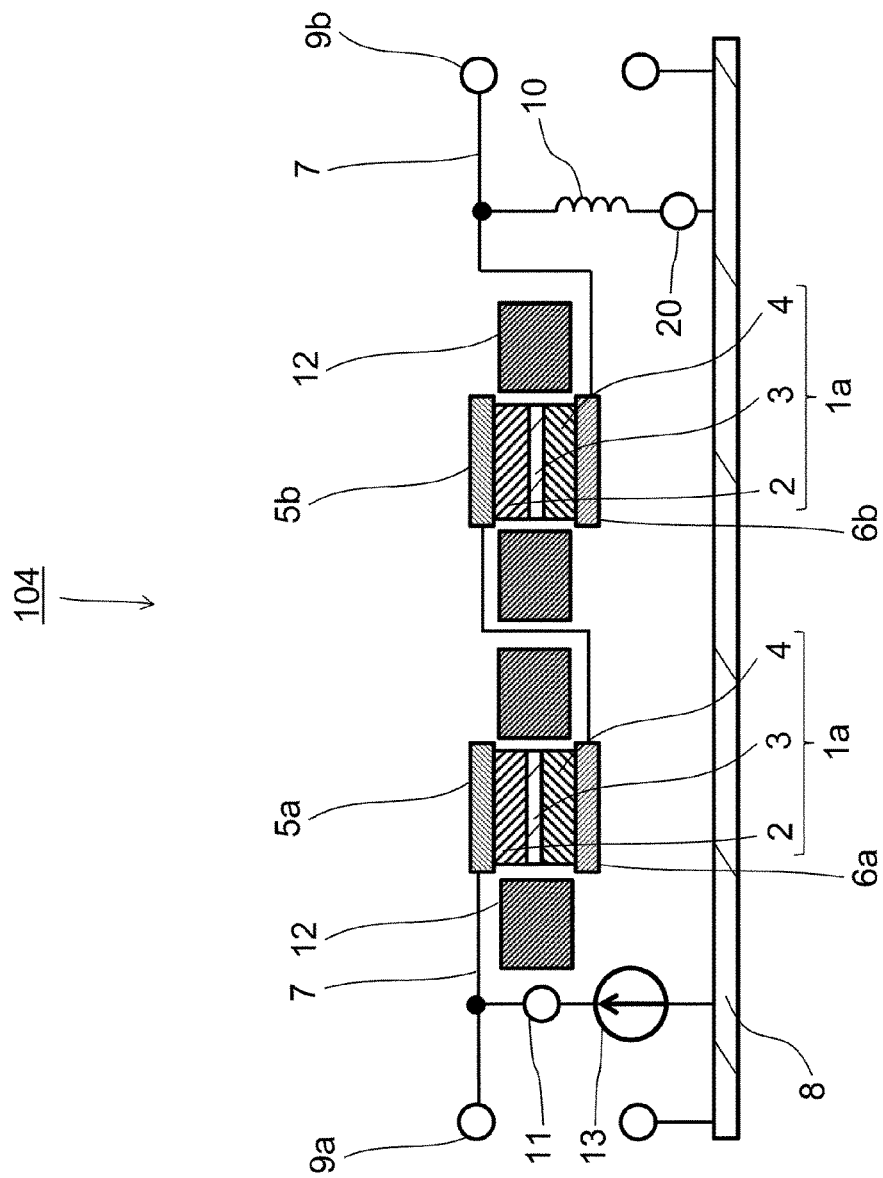
FIG. 12 is a schematic cross-sectional view of a magnetoresistive effect device according to a fifth embodiment.

FIG. 12 is a schematic cross-sectional view of a magnetoresistive effect device 104 according to a fifth embodiment of the present invention. Points different from the magnetoresistive effect device 100 of the first embodiment in the magnetoresistive effect device 104 will be mainly described and a description of common points will be appropriately omitted herein. The same reference numerals are used in the fifth embodiment to identify the same components in the magnetoresistive effect device 100 of the first embodiment and a description of the common components will be omitted herein. The magnetoresistive effect device 104 includes the two magnetoresistive effect elements 1a each including the magnetization fixed layer 2, the spacer layer 3, and the magnetization free layer 4, the upper electrodes 5a and 5b, the lower electrodes 6a and 6b, the first port 9a, the second port 9b, the signal line 7, the inductor 10, the direct-current input terminal 11, and the magnetic-field applying mechanisms 12 serving as the two frequency setting mechanisms. The two magnetoresistive effect elements 1a have the same configuration. The upper electrode 5a and the lower electrode 6a are arranged so as to sandwich one of the magnetoresistive effect elements 1a therebetween and the upper electrode 5b and the lower electrode 6b are arranged so as to sandwich the other of the magnetoresistive effect elements 1a therebetween. The two magnetoresistive effect elements 1a are connected in series to each other. The first port 9a, the magnetoresistive effect elements 1a, and the second port 9b are connected in series in this order via the signal line 7. The respective magnetic-field applying mechanisms 12 apply individual magnetic fields to the corresponding magnetoresistive effect elements 1a. As described above, the magnetoresistive effect device 104 includes the two magnetic-field applying mechanisms 12 so as to individually setting the spin torque resonance frequencies of the two respective magnetoresistive effect elements 1a. The inductor 10 is connected to the signal line 7 between the two magnetoresistive effect elements 1a, which are connected in series to each other, and the second port 9b (one of the signal line 7 between the two magnetoresistive effect elements 1a and the first port 9a and the signal line 7 between the two magnetoresistive effect elements 1a and the second port 9b) and is capable of being connected to the ground 8 via the reference voltage terminal 20. The direct-current input terminal 11 is connected to the signal line 7 between the two magnetoresistive effect elements 1a, which are connected in series to each other, and the first port 9a (the other of the signal line 7 between the two magnetoresistive effect elements 1a and the first port 9a and the signal line 7 between the two magnetoresistive effect elements 1a and the second port 9b). In other words, the direct-current input terminal 11 is connected to the signal line 7 at the opposite side to the inductor 10 with the two magnetoresistive effect elements 1a, which are connected in series to each other, in between the direct-current input terminal 11 and the inductor 10. A closed circuit including the two magnetoresistive effect elements 1a, the signal line 7, the inductor 10, the ground 8, and the direct-current input terminal 11 is capable of being formed when the magnetoresistive effect device 104 is connected to the ground 8. More specifically, in the magnetoresistive effect device 104, the connection of the inductor 10 to the ground 8 via the reference voltage terminal 20 and the connection of the direct-current source 13 connected to the ground 8 to the direct-current input terminal 11 enable the closed circuit including the two magnetoresistive effect elements 1a, which are connected in series to each other, the signal line 7, the inductor 10, the ground 8, and the direct-current input terminal 11 to be formed. The direct current supplied from the direct-current input terminal 11 flows through the closed circuit and is applied to the two magnetoresistive effect elements 1a.

The lower electrode 6a to which the magnetization free layer 4 of one of the magnetoresistive effect elements 1a is connected is electrically connected to the upper electrode 5b to which the magnetization fixed layer 2 of the other of the magnetoresistive effect elements 1a is connected. The two magnetoresistive effect elements 1a are connected in series to each other.

In the magnetoresistive effect device 104, the high-frequency signal is supplied to the two magnetoresistive effect elements 1a via the signal line 7 in a state in which the magnetic fields are individually applied from the respective magnetic-field applying mechanisms 12 to the corresponding magnetoresistive effect elements 1a. For example, the strength of the magnetic field to be applied to one of the magnetoresistive effect elements 1a is made smaller than the strength of the magnetic field to be applied to the other of the magnetoresistive effect elements 1a. The spin torque resonance frequencies of the two magnetoresistive effect elements 1a are different from each in this case.

Due to the spin torque resonance phenomenon, the frequency components that coincide with the spin torque resonance frequency of either of the two magnetoresistive effect elements 1a or that are near the spin torque resonance frequency of either of the two magnetoresistive effect elements 1a, among the high-frequency components of the high-frequency signal input through the first port 9a, are cut off by the two magnetoresistive effect elements 1a in which the combined impedance is in a high impedance state and which are connected in series to each other, and it is difficult to supply the frequency components to the second port 9b. The magnetoresistive effect device 104 may function as a high-frequency filter using the frequencies near the spin torque resonance frequency of either of the two magnetoresistive effect elements 1a as the cutoff frequency band.

Figure 13:
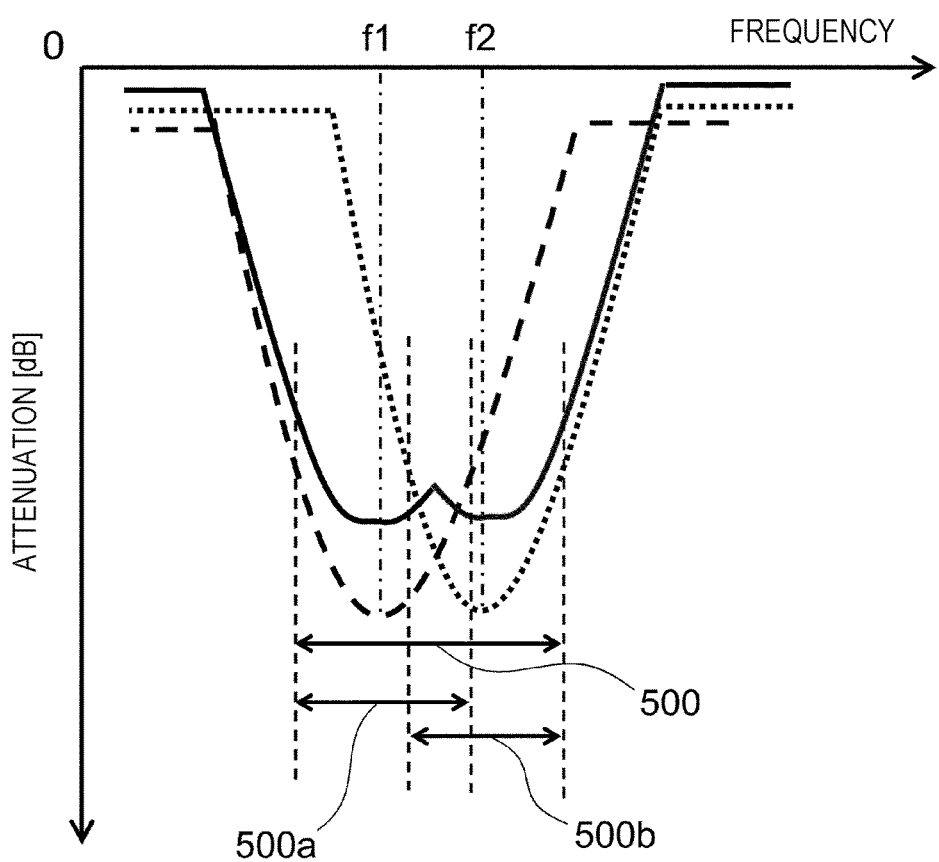
FIG. 13 is a graph illustrating the relationship between frequency and attenuation in the magnetoresistive effect device according to the fifth embodiment.

FIG. 13 is a graph illustrating the relationship between the frequency of the high-frequency signal input into the magnetoresistive effect device 104 and the attenuation. Referring to FIG. 13, the vertical axis represents attenuation and the horizontal axis represents frequency. For example, as illustrated in FIG. 13, when the magnetic field to be applied to one of the magnetoresistive effect elements 1a is made smaller than the magnetic field to be applied to the other of the magnetoresistive effect elements 1a, f1<f2 where f1 denotes the spin torque resonance frequency of one of the magnetoresistive effect elements 1a and f2 denotes the spin torque resonance frequency of the other of the magnetoresistive effect elements 1a. Accordingly, as illustrated in FIG. 13, adjusting the strength of the magnetic field to be applied from each of the magnetic-field applying mechanisms 12 to the corresponding magnetoresistive effect element 1a so that part of the frequencies near the spin torque resonance frequency f1 of one of the magnetoresistive effect elements 1a (a cutoff frequency band 500a illustrated in FIG. 13) is overlapped with part of the frequencies near the spin torque resonance frequency f2 of the other of the magnetoresistive effect elements 1a (a cutoff frequency band 500b illustrated in FIG. 13) allows the magnetoresistive effect device 104 to have a cutoff frequency band (a cutoff frequency band 500 illustrated in FIG. 13) wider than that of the magnetoresistive effect device 100 of the first embodiment, as illustrated in FIG. 13.

In addition, varying the direct current to be applied to each of the magnetoresistive effect elements 1a or the strength of the magnetic field to be applied from each of the magnetic-field applying mechanisms 12 to the corresponding magnetoresistive effect element 1a enables the bandwidth of the magnetoresistive effect device 104 to be arbitrarily varied. Accordingly, the magnetoresistive effect device 104 may function as a variable frequency filter capable of arbitrarily varying the cutoff frequency band.

As described above, since the magnetoresistive effect device 104 includes the multiple magnetic-field applying mechanisms 12 serving as the frequency setting mechanisms so as to individually set the spin torque resonance frequencies of the multiple magnetoresistive effect elements 1a, the magnetoresistive effect device 104 is capable of individually controlling the spin torque resonance frequencies of the respective magnetoresistive effect elements 1a. In addition, since the multiple magnetoresistive effect elements 1a are connected in series to each other, the impedance of the multiple magnetoresistive effect elements near the multiple frequencies equal to the spin torque resonance frequencies of the respective magnetoresistive effect elements 1a is increased and the cutoff frequency band 500 having a certain width is provided. Furthermore, varying the direct current or the magnetic field to be applied to each of the magnetoresistive effect elements 1a enables the bandwidth of the magnetoresistive effect device 104 to be arbitrarily varied. Accordingly, the magnetoresistive effect device 104 may function as a variable frequency filter capable of arbitrarily varying the cutoff frequency band.

Furthermore, although the two magnetoresistive effect elements 1a are connected in series to each other and the two frequency setting mechanisms (the two magnetic-field applying mechanisms 12) are provided so as to individually set the spin torque resonance frequencies of the respective magnetoresistive effect elements 1a in the magnetoresistive effect device 104 of the fifth embodiment, three or more magnetoresistive effect elements 1a may be connected in series to each other and three or more frequency setting mechanisms (three or more magnetic-field applying mechanisms 12) may be provided so as to individually set the spin torque resonance frequencies of the respective magnetoresistive effect elements 1a. The width of the cutoff frequency band is further increased in this case.

Furthermore, although the two magnetoresistive effect elements 1a have the same configuration in the magnetoresistive effect device 104 of the fifth embodiment, the multiple magnetoresistive effect elements may have different configurations.

Although the embodiments of the present invention have been described above, it will be clear that the present invention is not limited to these specific examples and embodiments and that many changes and modified embodiments will be obvious to those skilled in the art. For example, although the examples are described in the first to fifth embodiments in which the inductor 10 is connected to the signal line 7 between the magnetoresistive effect element 1a (1b) and the second port 9b and the direct-current input terminal 11 is connected to the signal line 7 between the magnetoresistive effect element 1a (1b) and the first port 9a, the inductor 10 may be connected to the signal line 7 between the magnetoresistive effect element 1a (1b) and the first port 9a and the direct-current input terminal 11 may be connected to the signal line between the magnetoresistive effect element 1a (1b) and the second port 9b.

Although the examples are described in the first to fifth embodiments in which the inductor 10 is used, a resistance element may be used, instead of the inductor 10. In this case, the resistance element is connected between the signal line 7 and the ground 8 and has a function to cut off the high-frequency components of the current with its resistance component. The resistance element may be a chip resistor or a resistor composed of a pattern line. The resistance value of the resistance element is preferably higher than the characteristic impedance of the signal line 7. For example, when the characteristic impedance of the signal line 7 is 50Ω, high-frequency power of 45% is capable of being cut with the resistance element if the resistance value of the resistance element is 50Ω and high-frequency power of 90% is capable of being cut with the resistance element if the resistance value of the resistance element is 500Ω. The use of the resistance element enables the direct current applied from the direct-current input terminal 11 to flow through a closed circuit including the magnetoresistive effect element 1a (1b), the signal line 7, the resistance element, the ground 8, and the direct-current input terminal 11 without degrading the characteristics of the high-frequency signal passing through the magnetoresistive effect element 1a (1b).

When the resistance element is used, instead of the inductor 10, it is preferable to connect a capacitor for cutting off the direct current signal in series to the signal line 7 between a connection portion to the signal line 7 of the direct-current input terminal 11 (or the resistance element) and the first port 9a and to connect a capacitor for cutting off the direct current signal in series to the signal line 7 between a connection portion to the signal line 7 of the resistance element (or the direct-current input terminal 11) and the second port 9b in order to cause the direct current applied from the direct-current input terminal 11 to efficiently flow through the closed circuit including the magnetoresistive effect element 1*a* (1*b*), the signal line 7, the resistance element, the ground 8, and the direct-current input terminal 11.

Although the examples are described in the first to fifth embodiments in which the magnetoresistive effect device 100 (101, 102, 103, and 104) include the magnetic-field applying mechanism 12 as the frequency setting mechanism (the effective magnetic field setting mechanism), the frequency setting mechanism (the effective magnetic field setting mechanism) may be realized in the following manner. For example, the anisotropy magnetic field $H_k$ in the magnetization free layer may be varied by applying an electric field to the magnetoresistive effect element and varying the electric field to vary the effective magnetic field in the magnetization free layer, thereby varying the spin torque resonance frequency of the magnetoresistive effect element. In this case, a mechanism to apply the electric field to the magnetoresistive effect element serves as the frequency setting mechanism (the effective magnetic field setting mechanism). Alternatively, the anisotropy magnetic field $H_k$ in the magnetization free layer may be varied by providing a piezoelectric body near the magnetization free layer, applying the electric field to the piezoelectric body to deform the piezoelectric body, and deforming the magnetization free layer to vary the effective magnetic field in the magnetization free layer, thereby varying the spin torque resonance frequency of the magnetoresistive effect element. In this case, a mechanism to apply the electric field to the piezoelectric body and the piezoelectric body serve as the frequency setting mechanism (the effective magnetic field setting mechanism). Alternatively, the exchange coupling magnetic field $H_{EX}$ in the magnetization free layer may be varied by providing a control film that has an electromagnetic effect and that is made of an antiferromagnetic material or a ferromagnetic material so as to be magnetically coupled to the magnetization free layer, applying the magnetic field and the electric field to the control film, and varying at least one of the magnetic field and the electric field to be applied to the control film to vary the effective magnetic field in the magnetization free layer, thereby varying the spin torque resonance frequency of the magnetoresistive effect element. In this case, a mechanism to apply the magnetic field to the control film, a mechanism to apply the electric field to the control film, and the control film serve as the frequency setting mechanism (the effective magnetic field setting mechanism).

If the spin torque resonance frequency of each magnetoresistive effect element has a desired value even when the frequency setting mechanism is not provided (the magnetic field is not applied from the magnetic-field applying mechanism 12), the frequency setting mechanism (the magnetic-field applying mechanism 12) may not be provided.

What is claimed is:

1. A magnetoresistive effect device comprising:
   at least one magnetoresistive effect element including a magnetization fixed layer, a magnetization free layer, and a spacer layer arranged between the magnetization fixed layer and the magnetization free layer;
   a first port through which a high-frequency signal is input;
   a second port through which a high-frequency signal is output;
   a signal line;
   an inductor or a resistance element; and
   a direct-current input terminal,
   wherein the first port, the magnetoresistive effect element, and the second port are connected in series in this order via the signal line,
   wherein the inductor or the resistance element is connected to one of the signal line between the magnetoresistive effect element and the first port and the signal line between the magnetoresistive effect element and the second port and is capable of being connected to ground,
   wherein the direct-current input terminal is connected to the other of the signal line between the magnetoresistive effect element and the first port and the signal line between the magnetoresistive effect element and the second port,
   wherein a closed circuit including the magnetoresistive effect element, the signal line, the inductor, the ground and direct-current input terminal or a closed circuit including the magnetoresistive effect element, the signal line, the resistance element, the ground, and direct-current input terminal is capable of being formed, and
   wherein the magnetoresistive effect element is arranged so that direct current supplied from the direct-current input terminal flows through the magnetoresistive effect element in a direction from the magnetization fixed layer to the magnetization free layer.

2. The magnetoresistive effect device according to claim 1, further comprising;
   at least one frequency setting mechanism capable of setting a spin torque resonance frequency of the magnetoresistive effect element.

3. The magnetoresistive effect device according to claim 2,
   wherein the frequency setting mechanism is an effective magnetic field setting mechanism capable of setting an effective magnetic field in the magnetization free layer and is capable of varying the spin torque resonance frequency of the magnetoresistive effect element by varying the effective magnetic field.

4. The magnetoresistive effect device according to claim 1,
   wherein the at least one magnetoresistive effect element includes a plurality of magnetoresistive effect elements having different spin torque resonance frequencies, and
   wherein the magnetoresistive effect elements are connected in parallel to each other.

5. The magnetoresistive effect device according to claim 2,
   wherein the at least one magnetoresistive effect element includes a plurality of magnetoresistive effect elements,
   wherein the magnetoresistive effect elements are connected in parallel to each other, and
   wherein the at least one frequency setting mechanism includes a plurality of frequency setting mechanisms so that the spin torque resonance frequencies of the magnetoresistive effect elements are capable of being individually set.

6. The magnetoresistive effect device according to claim 1,
   wherein the at least one magnetoresistive effect element includes a plurality of magnetoresistive effect elements having different spin torque resonance frequencies, and
   wherein the magnetoresistive effect elements are connected in series to each other.

7. The magnetoresistive effect device according to claim 2,
   wherein the at least one magnetoresistive effect element includes a plurality of magnetoresistive effect elements,
   wherein the magnetoresistive effect elements are connected in series to each other, and wherein the at least one frequency setting mechanism includes a plurality of frequency setting mechanisms so that the spin torque resonance frequencies of the magnetoresistive effect elements are capable of being individually set.

8. The magnetoresistive effect device according to claim 4, wherein plan view shapes of the magnetoresistive effect elements having different spin torque resonance frequencies are different from each other in aspect ratio.

9. The magnetoresistive effect device according to claim 6, wherein plan view shapes of the magnetoresistive effect elements having different spin torque resonance frequencies are different from each other in aspect ratio.

* * * * *